US009654713B2

(12) United States Patent
Hynecek et al.

(10) Patent No.: US 9,654,713 B2
(45) Date of Patent: May 16, 2017

(54) IMAGE SENSORS, METHODS, AND PIXELS WITH TRI-LEVEL BIASED TRANSFER GATES

(71) Applicant: Alexander Krymski, Sunny Isles Beach, FL (US)

(72) Inventors: Jaroslav Hynecek, Allen, TX (US); Alexander Krymski, Sunny Isles Beach, FL (US)

(73) Assignee: Alexander Krymski, Sunny Isles Beach, FL (US)

( * ) Notice: Subject to any disclaimer, the term of this patent is extended or adjusted under 35 U.S.C. 154(b) by 110 days.

(21) Appl. No.: 14/633,056

(22) Filed: Feb. 26, 2015

(65) Prior Publication Data
US 2015/0171122 A1 Jun. 18, 2015

Related U.S. Application Data

(62) Division of application No. 14/061,697, filed on Oct. 23, 2013, now Pat. No. 9,369,648.

(60) Provisional application No. 61/836,579, filed on Jun. 18, 2013.

(51) Int. Cl.
*H04N 5/374* (2011.01)
*H04N 5/3745* (2011.01)
*H01L 27/146* (2006.01)

(52) U.S. Cl.
CPC ... *H04N 5/37452* (2013.01); *H01L 27/14612* (2013.01); *H01L 27/14614* (2013.01); *H01L 27/14689* (2013.01); *H01L 27/14616* (2013.01); *H01L 27/14656* (2013.01)

(58) Field of Classification Search
CPC ... H04N 5/3559; H04N 5/359; H04N 5/37452
USPC ......................................................... 348/374
See application file for complete search history.

(56) References Cited

U.S. PATENT DOCUMENTS

| 3,758,794 A | 9/1973 | Kosonocky |
| 4,309,624 A | 1/1982 | Hynecek et al. |
| 4,490,682 A | 12/1984 | Poulo |
| 4,974,043 A * | 11/1990 | Stevens ............. H01L 27/14887 257/225 |

(Continued)

OTHER PUBLICATIONS

Office Action issued for U.S. Appl. No. 14/061,697 dated May 28, 2015.

(Continued)

*Primary Examiner* — Anthony J Daniels
(74) *Attorney, Agent, or Firm* — Foley & Lardner LLP

(57) ABSTRACT

An image sensor includes at least one pixel with a transfer gate that is controllable among at least three biasing conditions, including a first biasing condition in which electrons are transferable from a photodiode to a potential well under the transfer gate, a second biasing condition in which the electrons are confined in the potential well under the transfer gate, and a third biasing condition in which the electrons are transferable out of the potential well under the transfer gate. The pixel includes a p+ type doped barrier implant located at least partially under a portion of the transfer gate, and a pinned charge transfer barrier located on the opposite side of the transfer gate from the photodiode that includes a p+ type doped region and an n-type doped region. The image sensor can operate in a global shutter mode and/or a rolling shutter mode.

18 Claims, 9 Drawing Sheets

(56) References Cited

U.S. PATENT DOCUMENTS

| | | | |
|---|---|---|---|
| 5,541,402 A | 7/1996 | Ackland et al. | |
| 5,625,210 A | 4/1997 | Lee et al. | |
| 5,757,520 A | 5/1998 | Takashima | |
| 6,107,655 A | 8/2000 | Guidash | |
| 6,115,065 A | 9/2000 | Yadid-Pecht et al. | |
| 6,124,819 A | 9/2000 | Zhou et al. | |
| 6,137,432 A | 10/2000 | Xiao | |
| 6,259,124 B1 | 7/2001 | Guidash | |
| 6,352,869 B1 | 3/2002 | Guidash | |
| 6,396,430 B1 | 5/2002 | Li | |
| 6,545,624 B2 | 4/2003 | Lee et al. | |
| 6,552,745 B1 | 4/2003 | Perner | |
| 6,573,936 B2 | 6/2003 | Morris et al. | |
| 6,657,665 B1 | 12/2003 | Guidash | |
| 6,661,457 B1 | 12/2003 | Mathur et al. | |
| 6,670,904 B1 | 12/2003 | Yakovlev | |
| 6,750,485 B2 | 6/2004 | Berezin et al. | |
| 6,870,565 B1 | 3/2005 | Blerkom et al. | |
| 6,953,923 B2 | 10/2005 | Yang et al. | |
| 7,205,522 B2 | 4/2007 | Krymski | |
| 7,238,977 B2 | 7/2007 | Hong et al. | |
| 7,336,214 B2 | 2/2008 | Krymski | |
| 7,361,877 B2 | 4/2008 | McGrath et al. | |
| 7,388,239 B2 | 6/2008 | Fossum et al. | |
| 7,400,279 B2 | 7/2008 | Krymski | |
| 7,408,443 B2 | 8/2008 | Nam | |
| 7,436,496 B2 | 10/2008 | Kawahito | |
| 7,443,437 B2 | 10/2008 | Altice et al. | |
| 7,471,324 B2 | 12/2008 | Tu et al. | |
| 7,488,928 B2 | 2/2009 | Krymski | |
| 7,489,357 B2 | 2/2009 | Nakada | |
| 7,659,925 B2 | 2/2010 | Krymski | |
| 7,804,438 B2 | 9/2010 | Krymski | |
| 7,876,362 B2 | 1/2011 | Krymski | |
| 7,880,786 B2 | 2/2011 | Muramatsu | |
| 8,174,603 B2 | 5/2012 | Krymski | |
| 8,710,559 B2 * | 4/2014 | Kobayashi | H01L 27/1461 257/290 |
| 2003/0011829 A1 | 1/2003 | Dierickx | |
| 2003/0043089 A1 | 3/2003 | Hanson et al. | |
| 2004/0021787 A1 | 2/2004 | Cho | |
| 2004/0051801 A1 | 3/2004 | Iizuka et al. | |
| 2005/0237408 A1 | 10/2005 | Muramatsu | |
| 2006/0044437 A1 | 3/2006 | Shah | |
| 2006/0261246 A1 | 11/2006 | Krymski | |
| 2007/0045514 A1 | 3/2007 | McKee et al. | |
| 2007/0076109 A1 | 4/2007 | Krymski | |
| 2007/0139242 A1 | 6/2007 | Krymski | |
| 2007/0257720 A1 | 11/2007 | Krymski | |
| 2008/0258042 A1 | 10/2008 | Krymski | |
| 2008/0296645 A1* | 12/2008 | Itonaga | H01L 27/14609 257/294 |
| 2009/0273500 A1 | 11/2009 | Krymski | |
| 2009/0273694 A1 | 11/2009 | Krymski | |
| 2009/0273696 A1 | 11/2009 | Krymski | |
| 2010/0097507 A1 | 4/2010 | Krymski | |
| 2010/0128157 A1 | 5/2010 | Panicacci | |
| 2011/0080492 A1 | 4/2011 | Matsuda et al. | |
| 2011/0085064 A1 | 4/2011 | Nishide | |
| 2011/0139963 A1 | 6/2011 | Krymski | |
| 2011/0205416 A1* | 8/2011 | Nishihara | H01L 27/14609 348/300 |
| 2011/0315854 A1* | 12/2011 | Janesick | G01J 1/46 250/208.1 |
| 2012/0019698 A1 | 1/2012 | Ui et al. | |
| 2012/0033119 A1* | 2/2012 | Shinohara | H01L 27/14623 348/302 |
| 2012/0080733 A1* | 4/2012 | Doan | H01L 27/1463 257/292 |
| 2012/0168609 A1 | 7/2012 | Krymski | |
| 2012/0175498 A1 | 7/2012 | Krymski | |
| 2012/0193692 A1* | 8/2012 | Kawahito | H01L 27/14609 257/292 |
| 2012/0273654 A1 | 11/2012 | Hynecek et al. | |
| 2013/0027594 A1 | 1/2013 | Krymski | |
| 2014/0063304 A1 | 3/2014 | Manabe et al. | |
| 2014/0299747 A1* | 10/2014 | Tachino | H01L 27/14614 250/208.1 |
| 2015/0109496 A1 | 4/2015 | Hirota | |

OTHER PUBLICATIONS

U.S. Office Action dated Oct. 2, 2015 for U.S. Appl. No. 14/061,697.

U.S. Office Action dated Nov. 24, 2015 for U.S. Appl. No. 14/061,697.

Yasutomi et al., "A 2.7e-Temporal Noise 99.7% Shutter Efficiency 92dB Dynamic Range CMOS Image Sensor with Dual Global Shutter Pixels," IEEE International Solid-State Circuits Conference Digest of Technical Papers (ISSCC), 2010, pp. 398-399.

Bock et al., "A Wide-VGA CMOS Image Sensor with Global Shutter and Extended Dynamic Range," Proc. of IEEE Workshop on CCDs and AIS, Karuizawa, 2005, pp. 222-225.

US Notice of Allowance dated Apr. 21, 2016, from related U.S. Appl. No. 14/061,697.

* cited by examiner

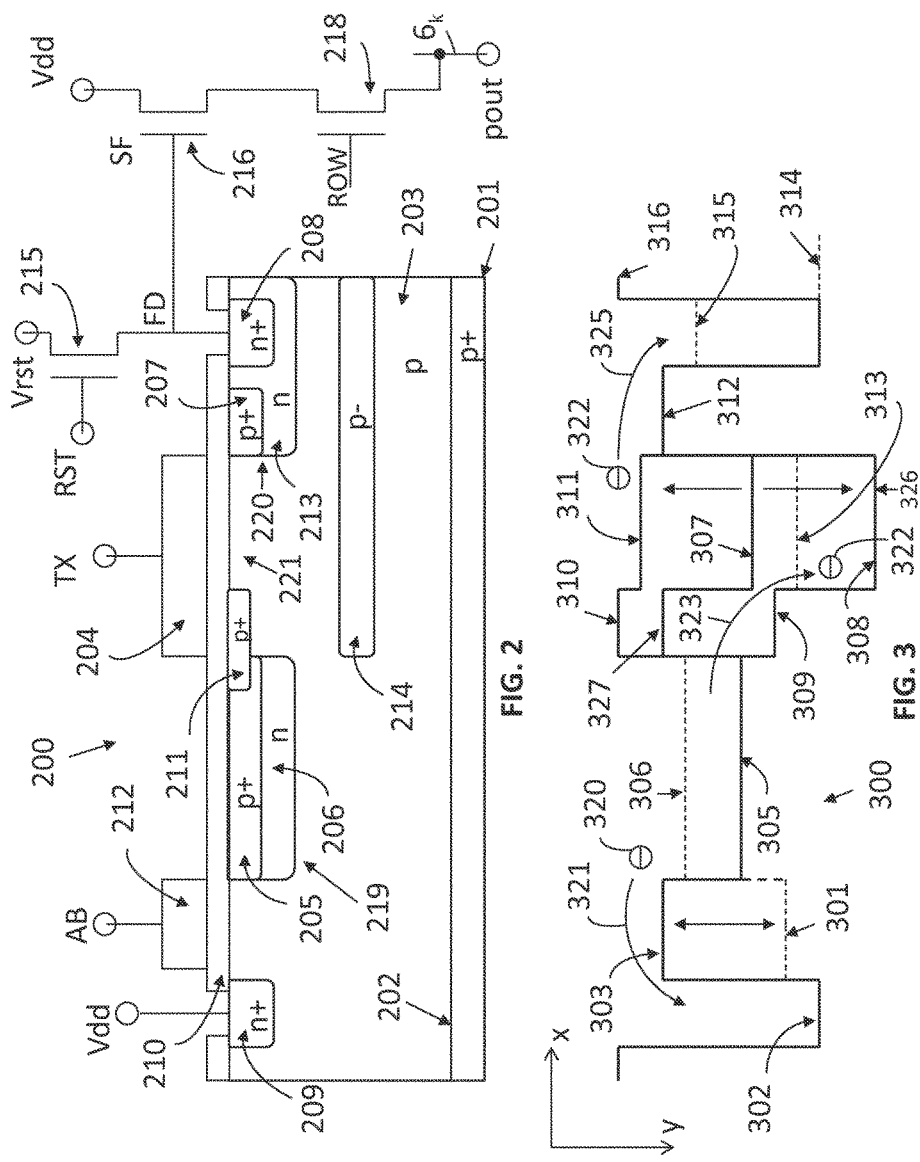

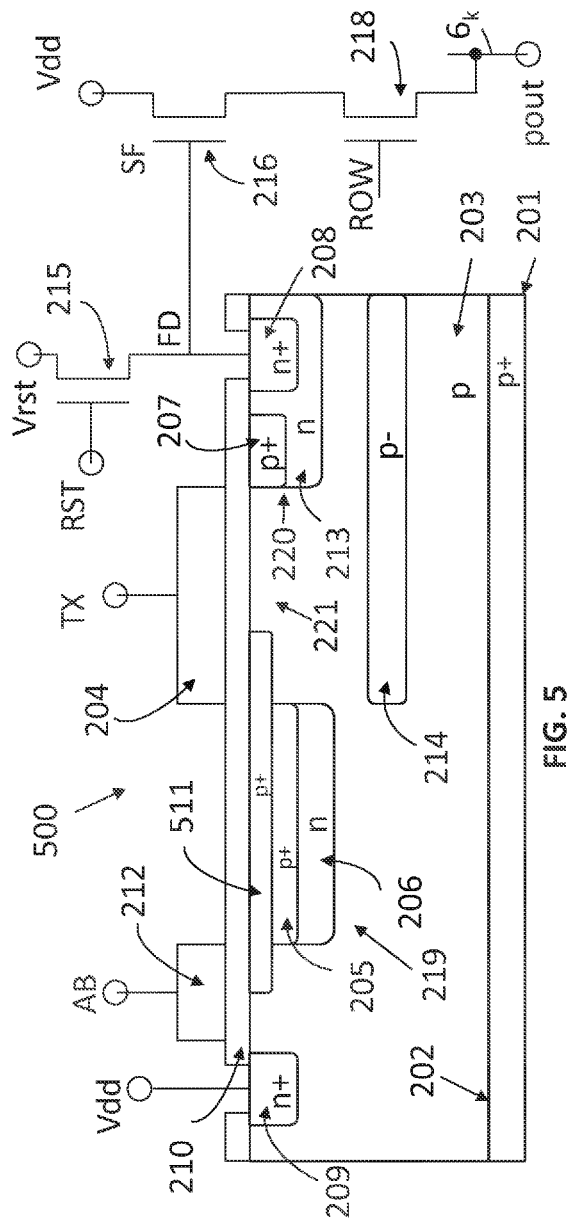
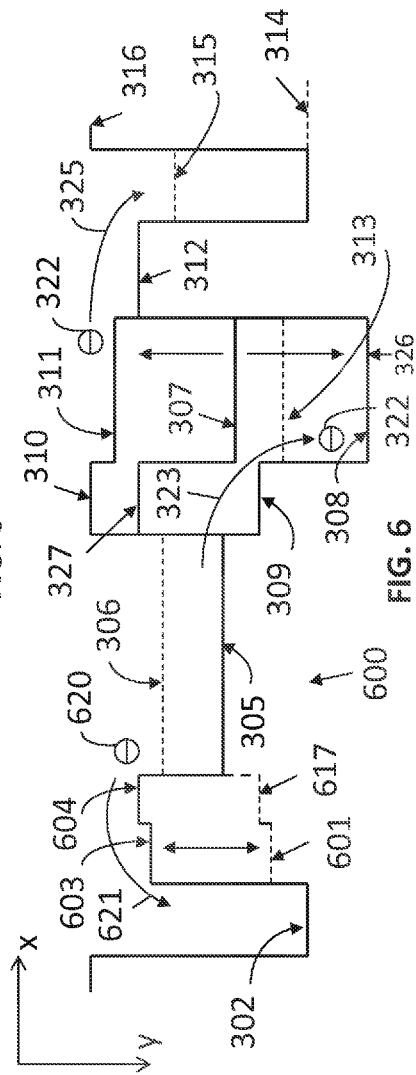
FIG. 5
FIG. 6

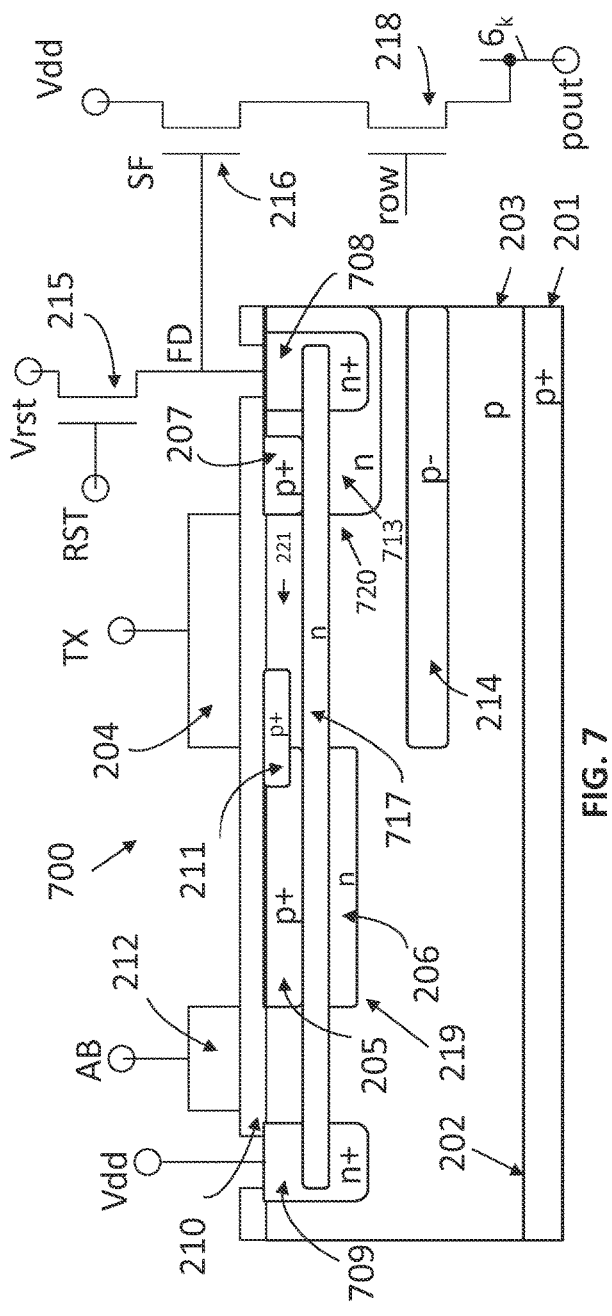
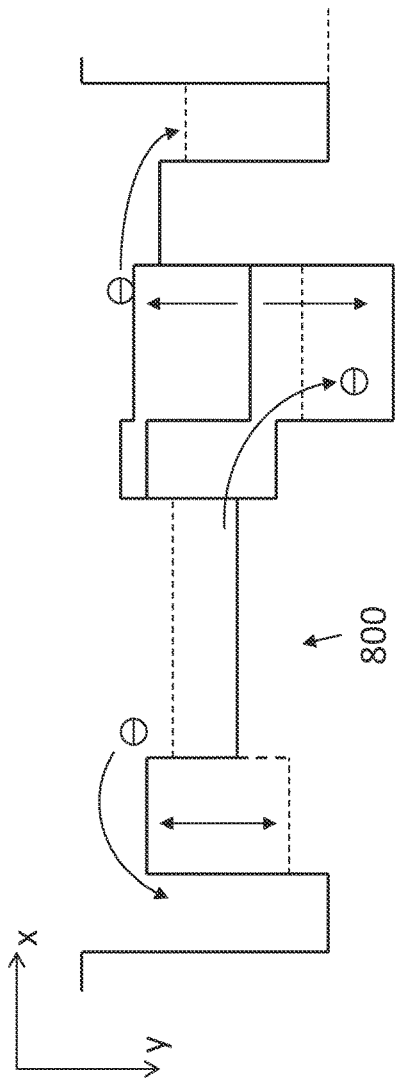
FIG. 7
FIG. 8

IMAGE SENSORS, METHODS, AND PIXELS WITH TRI-LEVEL BIASED TRANSFER GATES

CROSS-REFERENCE TO RELATED PATENT APPLICATIONS

This application is a divisional application of U.S. patent application Ser. No. 14/061,697, filed Oct. 23, 2013, which claims priority from U.S. Provisional Patent App. Ser. No. 61/836,579, filed Jun. 18, 2013, the entire contents of both of which are incorporated by reference herein.

BACKGROUND OF THE INVENTION

1. Field of the Invention

Embodiments of the present invention relate generally to image sensors, pixels, methods of using image sensors and pixels, and methods of manufacturing image sensors and pixels.

2. Related Art

Image sensors typically sense light by converting impinging photons into electrons that are integrated (collected) in sensor pixels. After completion of an integration cycle in an image sensor, collected charge is usually converted into voltages that are supplied to output terminals of the image sensor. In Complementary Metal-Oxide Semiconductor (CMOS) image sensors, the charge to voltage conversion is typically accomplished directly in the pixels themselves and the analog pixel voltages are transferred to output terminals using various pixel addressing and scanning schemes. In some image sensors, the analog pixel voltage signals are converted on-chip to digital equivalents before reaching the image sensor output terminals.

The pixels in some image sensors have incorporated in them a buffer amplifier, which is typically a Source Follower (SF) that drives corresponding sense lines that are connected to the pixels by suitable addressing transistors. In some designs, the SF itself may also be used in an addressing function and the addressing transistors can be eliminated. In some types of pixels, after charge to voltage conversion is completed and the resulting signals have been transferred out from the pixels, the pixels are reset in order to be ready for accumulation of new charge. In some pixels that use a Floating Diffusion (FD) as a charge detection node, the reset is accomplished by momentarily turning on a reset transistor that conductively connects the FD to a voltage reference, which is typically the pixel drain node. That reset step removes collected charge, but it generates kTC-reset noise as is well known in the art. In some image sensors, kTC-reset noise is at least partially removed from the signals by a Correlated Double Sampling (CDS) signal processing technique in order to achieve a desired low noise performance. The typical CMOS image sensors that utilize the CDS concept usually require at least three transistors or four transistors (4T) in the pixel. An example of a 4T pixel circuit with a pinned photodiode can be found in U.S. Pat. No. 5,625,210 by Lee et al., issued Apr. 29, 1997, the entire content of which is incorporated by reference herein.

In modern CMOS image sensor designs, the circuitry for several photo-diodes may be shared as can be found, for example, in U.S. Pat. No. 6,657,665 by Guidash, issued Dec. 2, 2003, the entire content of which is incorporated by reference herein. In the Guidash patent, the pixel consists of two photo-diodes located in neighboring rows that share some circuitry. Such a shared circuit concept can result in having fewer metal bus lines in the row direction and column direction per photo-diode. The circuit sharing is very useful for designing small pixels or pixels with high Fill Factor (FF) since the spacing and the width of the metal lines essentially determines the minimum pixel size.

In some standard CMOS image sensors, the pixel scanning after charge has been accumulated in the pixels is performed in a sequential manner row by row. This generates an exposure time skew, which can be observed in pictures of moving objects, and which can cause an undesirable picture distortion. This method of CMOS image sensor scanning is called the "rolling shutter" mode. In most applications, however, it is preferable to expose all the pixels of an image sensor at the same time without the skew and thus eliminate the distortion of moving objects. This type of image sensor operation is called the "global shutter" mode. In order to implement this kind of global shuttering, another charge storage site is provided in the pixels. After charge is integrated in the photodiodes of the pixels, it is transferred to the pixel storage sites simultaneously in all the pixels of the pixel array where it can wait for the scanning in the row by row fashion. The pixel scanning time skew is thus independent of the frame pixel exposure time. Various methods for incorporating additional charge storage sites into CMOS image sensor pixels have required that the additional charge storage sites be shielded from impinging light.

In earlier CMOS image sensor shutter pixels, the photodiode and the storage node were implemented as diffusion regions in a semiconductor substrate. An example of such a pixel is described in U.S. Pat. No. 7,388,239 by Fossum et al. titled "Frame Shutter Pixel with an Isolated Storage Node," issued Jun. 17, 2008, the entire content of which is incorporated by reference herein. These pixels suffer from kTC noise of both photodiode capacitance and storage node capacitance.

The second generation of CMOS global shutter pixels had the photodiode implemented as a pinned photodiode. An example of such a pixel is described in N. Bock et al., "A Wide-VGA CMOS Image Sensor with Global Shutter and Extended Dynamic Range," Proc. of IEEE Workshop on CCDs and AIS, Karuizawa, 2005, pp. 222-225, the entire content of which is incorporated by reference herein. This pixel is often referred to as a "5T global shutter pixel." Because of a full charge transfer from the photodiode, there is no kTC noise associated with the photodiode. However, the kTC noise at the storage node remains.

A disclosure of a CMOS image sensor implementation with a global shutter pixel having in-pixel CDS was a further adoption of the well-known Interline Transfer Charge-Coupled Device (CCD) concept and it is described in U.S. Pat. No. 7,361,877 by McGrath et al. titled "Pinned-Photodiode Pixel with Global Shutter," issued Apr. 22, 2008, the entire content of which is incorporated by reference herein and which is hereinafter referred to as the "McGrath '877 patent". The global shutter pixel in the McGrath '877 patent has a pinned diode as a detector and also as a storage node.

The McGrath '877 patent shows a simplified cross section of a pixel of a CMOS image sensor that has global shuttering capability. The pinned photodiode photodetector is made of a surface p+ pinning layer and a buried N doped layer. The storage node is made using a pinning p+ implant and a buried N doped implant. The storage node is placed in a P doped shielded well. The photodiode can be emptied and fully reset via an overflow gate (Gov) (which may also be called an Anti-Blooming gate), and this gate may control the exposure time. After the charge integration in the photodiode is completed, charge is transferred via a transfer gate transistor into a second pined photodiode where it waits for scanning. The charge transfer from the first to the second pinned diode is completed in a CCD fashion without generating any kTC noise. It is necessary that the charge storage pinned diode is well shielded from impinging photons with a metal shield to prevent undesirable smear effects when objects in a scene move.

In the McGrath '877 patent, the signal charge readout from the second pinned diode proceeds in the standard way by first resetting a sense node (which may also be called a Floating Diffusion) to a drain bias voltage by momentarily turning on a reset transistor followed by pulsing a charge transfer transistor gate. During a charge integration time, an anti-blooming reset gate bias is adjusted such that, for the pixels with maximum illumination, charge overflows the barrier and flows into a drain, thus preventing spreading of charge into the neighboring pixels. The pixel readout sequence in this device proceeds in a sequential order row by row. The signal appearing of the floating diffusion is buffered by a standard source follower transistor. For the pixel with the pinned photodiode and the pinned diode storage node to function properly, it is necessary that the second pinned photodiode has a higher pinning voltage or that the transfer gate has a potential barrier and a well incorporated in it, as described in an article by Yasutomi et al. titled "A 2.7e$^-$ Temporal Noise 99.7% Shutter Efficiency 92 dB Dynamic Range CMOS Image Sensor with Dual Global Shutter Pixels," IEEE International Solid-State Circuits Conference Digest of Technical Papers (ISSCC), 2010, pp. 398-399, the entire content of which is incorporated by reference herein.

Using pinned diodes for charge storage is advantageous since it is well known that these diodes have a low dark current generation. High dark current in storage sites would add to noise and would also generate undesirable shading effects in pictures that would have to be compensated for. Unfortunately, a second pinned diode consumes a significant valuable pixel area, thus increasing the size of the image sensor and ultimately its cost. This concept also consumes a larger amount of the voltage budget that is available for the pixel operation. Moreover, a standard transfer gate has a problem of large dark current generation at the interface between the silicon and silicon-dioxide, which may degrade image sensor performance.

SUMMARY OF THE DISCLOSURE

Embodiments of the present invention relate to image sensors, pixels, methods of using image sensors and pixels, and methods of manufacturing image sensors and pixels. An image sensor in accordance with an embodiment includes at least one pixel with a transfer gate that is controllable among at least three biasing conditions, including a first biasing condition in which electrons are transferable from a photodiode to a potential well under the transfer gate, a second biasing condition in which the electrons are confined in the potential well under the transfer gate, and a third biasing condition in which the electrons are transferable out of the potential well under the transfer gate.

In various embodiments, the transfer gate is controllable to be in the second biasing condition when a voltage of a particular voltage level is applied to the transfer gate, and the transfer gate is controllable to be in the first biasing condition when a voltage at a level higher than the particular voltage level is applied to the transfer gate, and the transfer gate is controllable to be in the third biasing condition when a voltage at a level lower than the particular voltage level is applied to the transfer gate. In some embodiments, the transfer gate is in the first biasing condition if a voltage of 3.3 V or higher is applied to the transfer gate, the transfer gate is in the second biasing condition if a voltage of 1 V is applied to the transfer gate, and the transfer gate is in the third biasing condition if a voltage of 0 V or lower is applied to the transfer gate. Of course, those voltage values are merely provided as examples, and in various other embodiments any suitable voltages can be used.

In some embodiments, the pixel further includes a p+ type barrier implant located at least partially under a portion of the transfer gate, and a pinned charge transfer barrier located on an opposite side of the transfer gate from the photodiode, where the pinned charge transfer barrier comprises a p+ type doped region and an n-type doped region. In various embodiments, the p+ type barrier implant is configured such that if the transfer gate is controlled to be in the first biasing condition, a potential level of a transfer gate barrier provided by the p+ type barrier implant is set to allow electrons from the photodiode to flow into the potential well under the transfer gate.

In some embodiments, the p+ type barrier implant and the pinned charge transfer barrier are configured such that if the transfer gate is controlled to be in the second biasing condition, electrons are confined in the potential well under the transfer gate due to a potential level of a transfer gate barrier provided by the p+ type barrier implant and a potential level of the pinned charge transfer barrier. Also, in some embodiments, the pinned charge transfer barrier is configured such that if the transfer gate is controlled to be in the third biasing condition, a potential level of the pinned charge transfer barrier allows electrons to be transferred from the potential well under the transfer gate to a floating diffusion that is on the opposite side of the pinned charge transfer barrier from the potential well under the transfer gate.

In various embodiments, the pixel further includes a p-type epitaxial layer located at least partially under the transfer gate, and a p+ type barrier implant located in the epitaxial layer at least partially under a portion of the transfer gate. In some embodiments, the pixel further includes a p+ type doped implant and an n-type doped implant that form the photodiode, and the p+ type barrier implant extends at least partially into the photodiode. In some embodiments, the pixel further includes an antiblooming gate, and a portion of the p+ type barrier implant is located at least partially under a portion of the anti-blooming gate. Also, in some embodiments, the anti-blooming gate is located on the opposite side of the photodiode from the transfer gate, and the p+ type barrier implant extends from under the portion of the transfer gate across a length of the photodiode to under the portion of the anti-blooming gate.

In various embodiments, the pixel further includes a pinned charge transfer barrier located on the opposite side of the transfer gate from the photodiode, where the pinned charge transfer barrier comprises a p+ type doped region and an n-type doped region. In some embodiments, the pixel further includes a floating diffusion, and the pinned charge transfer barrier that interfaces with the floating diffusion. In some embodiments, the floating diffusion comprises an n+ type doped region. In some embodiments, the pixel further includes an anti-blooming gate and a buried channel that at least spans from the floating diffusion across a portion of the pinned charge transfer barrier, under the transfer gate, across a length of the photodiode, and under the anti-blooming gate. Also, in some embodiments, the buried channel comprises an n-type doped region.

An image sensor in accordance with an embodiment includes a pixel array with a plurality of pixels, and each pixel of the plurality of pixels includes a transfer gate that is controllable among a first biasing condition in which electrons are transferable from a corresponding photodiode to a potential well under the transfer gate, a second biasing condition in which the electrons are confined in the potential well under the transfer gate, and a third biasing condition in which the electrons are transferable out of the potential well under the transfer gate.

In some embodiments, the pixel array is controllable to operate in a global shutter mode in which the transfer gate of each pixel of the plurality of pixels in the pixel array is simultaneously in the first biasing condition so as to transfer charge at a same time and then simultaneously in the second biasing condition to store charge. Also, in some embodiments, the pixel array is controllable in the global shutter mode to have the transfer gate of each pixel in a row of the pixel array placed in the third biasing condition at a same time, so as to transfer charge for read out. In some embodiments, the pixel array is controllable to operate in a rolling shutter mode in which the transfer gate of each pixel in a row of the pixel array is placed in the first biasing condition and then in the third biasing condition and then at a different time each pixel in another row of the pixel array is placed in the first biasing condition and then in the third biasing condition.

In various embodiments, the pixel array further includes a source follower transistor connected to two or more pixels of the plurality of pixels for reading out charge from each of the two or more pixels. In some embodiments, the pixel array further includes a floating diffusion that is shared among two or more pixels of the plurality of pixels for receiving charge from the potential well under the transfer gate of each of the two or more pixels. Also, in some embodiments, the pixel array further includes a reset transistor that is connected to the floating diffusion and that is shared among the two or more pixels.

In various embodiments, the pixel array further includes a source follower transistor connected to two floating diffusions of two pixels of the plurality of pixels for reading out charge from each of the two pixels, a floating diffusion that is shared among the two pixels for receiving charge from the potential well under the transfer gate of each of the two pixels, a reset transistor that is connected to the floating diffusion and that is shared among the two pixels, and an addressing transistor connected to the source follower transistor and that is shared among the two pixels, where the two pixels are positioned diagonal to each other in the pixel array. In some embodiments, the pixel array further includes one or more anti-blooming gates and drains that are shared among several pixels of the plurality of pixels. Also, in some embodiments, anti-blooming gates and drains of each even row of pixels in the pixel array are shared with a corresponding neighboring odd row of pixels in the pixel array.

A method of operating an image sensor in accordance with an embodiment includes controlling a transfer gate to be in a first biasing condition to set a potential level of a transfer gate barrier such that electrons flow from a photodiode into a potential well under the transfer gate, and controlling the transfer gate to be in a second biasing condition to set the potential level of the transfer gate barrier such that electrons remain confined in the potential well under the transfer gate due to the potential level of the transfer gate barrier and a potential level of a pinned charge transfer barrier. In various embodiments, the method further includes controlling the transfer gate to be in a third biasing condition such that electrons flow from the potential well under the transfer gate over the pinned charge transfer barrier to a floating diffusion.

A method of manufacturing a pixel in accordance with an embodiment includes providing an epitaxial layer that is a p-type layer, forming a photodiode in the epitaxial layer, where the photodiode includes an n-type doped implant and a p+ type doped implant, providing a barrier implant that is a p+ type implant at least partially in the epitaxial layer and at least partially in the photodiode, forming a pinned charge transfer barrier that includes a p+ type doped region and an n-type doped region in the epitaxial layer, and forming a transfer gate over at least a portion of the barrier implant.

In various embodiments, the pinned charge transfer barrier is on the opposite side of the transfer gate from the photodiode. In some embodiments, the pinned charge transfer barrier is formed to interface with a floating diffusion. Also, in some embodiments, another portion of the barrier implant is formed to be under a portion of an anti-blooming gate. In various embodiments, the method further includes forming a buried channel that spans at least from a floating diffusion across a length of the pinned charge transfer barrier, under the transfer gate, across a length of the photodiode, and under an anti-blooming gate. Also, in various embodiments, the p+ implant for the barrier implant is implanted before poly deposition using a shallow BF2 implant.

CMOS image sensors in accordance with various embodiments have both global shutter and rolling shutter capabilities. Various embodiments incorporate a special transfer gate into the pixels that can transfer charge, and that can also store charge, and that is operated between three different bias levels. In various embodiments, a positive pulse applied to the transfer gate from a mid-level bias transfers charge from a photodiode to under the transfer gate where it is stored. Also, in various embodiments, a negative pulse applied to the transfer gate from the mid-level bias transfers charge onto a floating diffusion. It is thus possible in various embodiments, by controlling the positive and negative pulse sequences to the transfer gate, to operate an image sensor in a global shutter mode or in a rolling shutter mode. In various embodiments, pixels can be operated using a Correlated Double Sampling signal processing method to remove kTC noise, which results in high performance. The transfer gate in various embodiments may also be called a storage gate, since it is capable of both transferring and storing charge.

BRIEF DESCRIPTION OF THE DRAWINGS

FIG. 2 shows a cross sectional view of an embodiment of a pixel in accordance with an embodiment with a transfer gate that can store charge and that is operated between at least three bias levels;

FIG. 3 is a potential profile diagram across the pixel of FIG. 2 corresponding to various regions in the pixel and showing the potentials for various gate biasing conditions;

FIG. 5 is another embodiment of a pixel where a barrier under the transfer gate is fabricated symmetrically for a transfer gate and an anti-blooming gate;

FIG. 6 is a potential profile diagram corresponding to the embodiment of the pixel of FIG. 5;

FIG. 7 is a cross sectional view of another embodiment of a pixel that includes a buried channel;

FIG. 8 is a potential profile diagram corresponding to the embodiment of the pixel of FIG. 7;

DETAILED DESCRIPTION OF PREFERRED EMBODIMENTS

Figure 1:
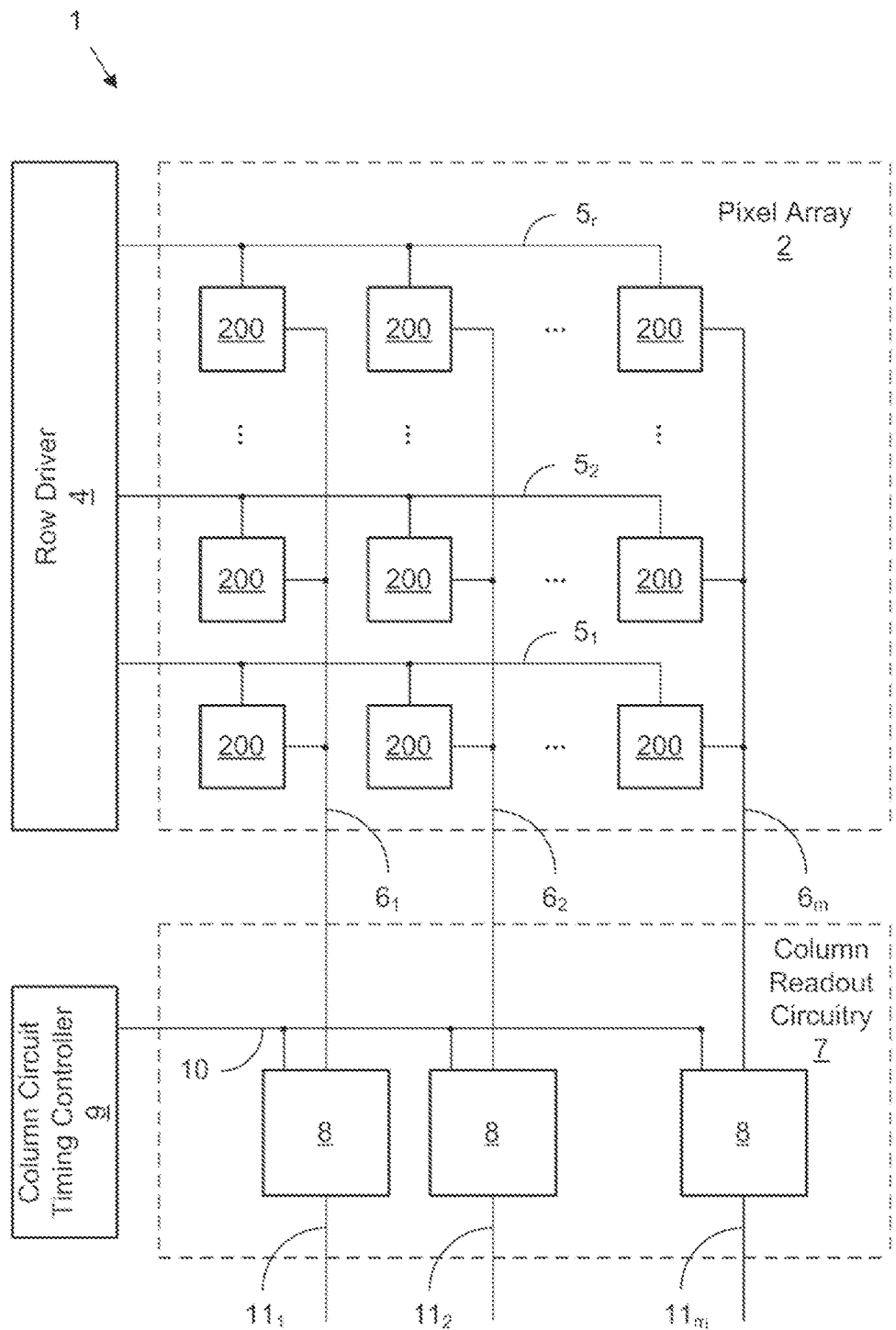
FIG. 1 illustrates architecture of an image sensor array in accordance with an embodiment.

FIG. 1 illustrates architecture of an image sensor 1 in accordance with an embodiment. The image sensor 1 includes a pixel array 2, a row driver 4, column readout circuitry 7, and a column circuit timing controller 9. The pixel array 2 includes pixels 200 that are arranged in rows and columns. Each pixel 200 includes a light sensitive element, such as a photodiode, or the like, to sample light intensity of a corresponding portion of a scene being imaged, and each pixel 200 is configured to produce an analog pixel signal based on the sampled light intensity. The row driver 4 supplies control signals to the pixels 200 in the pixel array 2 to control an operation of the pixels 200 in the pixel array 2.

Pixels 200 that are in a same row of the pixel array 2 share common row control signals from the row driver 4. For example, pixels 200 in a first row of the pixel array 2 share common row control lines $5_1$ for receiving control signals from the row driver 4. Similarly, pixels 200 in a second row of the pixel array 2 share common row control lines $5_2$ for receiving control signals from the row driver 4, and pixels 200 in an $r^{th}$ row of the pixel array 2 share common row control lines $5_r$ for receiving control signals from the row driver 4. Pixels 200 that are in a same column of the pixel array 2 share a common column readout line to provide output. For example, pixels 200 in a first column of the pixel array 2 share a column readout line $6_1$, pixels 200 in a second column of the pixel array 2 share a column readout line $6_2$, and pixels 200 in an $m^{th}$ column of the pixel array 2 share a column readout line $6_m$. The row driver 4 controls the pixels 200 to provide output row by row.

The column readout circuitry 7 includes a column readout circuit 8 for each column of pixels 200 in the pixel array 2. Each column readout circuit 8 is connected to receive analog signals from a corresponding column readout line, and is configured to provide digital output on a corresponding output line. For example, the column readout circuit 8 for the first column is connected to the column readout line $6_1$ for receiving input, and is connected to an output line $11_1$ for providing output. Similarly, the column readout circuit 8 for the second column is connected to the column readout line $6_2$ for receiving input, and is connected to an output line $11_2$ for providing output, and the column readout circuit 8 for the $m^{th}$ column is connected to the column readout line $6_m$ for receiving input, and is connected to an output line $11_m$ for providing output. The column circuit timing controller 9 is configured to provide control signals to the plurality of column readout circuits 8 over one or more control lines 10.

FIG. 2 is a cross sectional view of the pixel 200 in accordance with an embodiment, and FIG. 3 shows an associated potential diagram for the pixel 200 of FIG. 2 drawn in the direction from a photodiode (PD) 219 to a floating diffusion (FD) 208. With reference to FIGS. 2 and 3, the pixel 200 is fabricated on a substrate 201 that has a p+ type doped layer 202 and an epitaxial layer 203 deposited on it. In various embodiments, the epitaxial layer 203 is a p-type layer. The epitaxial layer 203 has an oxide layer 210 deposited on top of it that provides the necessary isolations of gates from the substrate 201. The region of the pinned photodiode 219 is formed by a p+ type doped implant 205 and an n-type doped implant 206 where the potential well for the photodiode 219 is formed and photo-generated charge integrated.

The photodiode 219 interfaces with a charge transfer gate 204, and a barrier implant 211 is located in the epitaxial layer 203 under a portion of the transfer gate 204. In various embodiments, the barrier implant 211 is a p+ type implant. A region of a pinned charge transfer barrier 220 that interfaces with a region of the transfer gate 204 is formed by a p+ type doped region 207 and an n-type doped region 213. The pinned charge transfer barrier 220 further interfaces with a region of the floating diffusion 208 that is an n+ type region and that is connected to a gate of a source follower (SF) transistor 216. The region of the pinned photodiode 219 also interfaces with a region of an anti-blooming gate 212 that further interfaces with a charge drain 209. The drain 209 includes an n+ type region and is connected to a power source to receive a drain voltage (Vdd).

The transfer gate 204 is connected to receive a transfer gate control signal (TX) and the transfer gate 204 is controllable by the transfer gate control signal TX. The anti-blooming gate 212 is connected to receive an anti-blooming gate control signal (AB), and the anti-blooming gate 212 is controllable by the anti-blooming gate control signal AB. A first terminal of a reset transistor 215 is connected to a reset voltage source that provides a reset voltage (Vrst). A gate of the reset transistor 215 is connected to receive a reset control signal (RST), and the reset transistor 215 is controllable by the reset control signal RST. A second terminal of the reset transistor 215 is connected to the floating diffusion 208 and to the gate of the source follower transistor 216.

A first terminal of the source follower transistor 216 is connected to the power source to receive the drain voltage (Vdd). A second terminal of the source follower transistor 216 is connected to a first terminal of a row select transistor 218. A gate of the row select transistor 218 is connected to receive a row select control signal (ROW), and the row select transistor 218 is controllable by the row select control signal ROW. A second terminal of the row select transistor 218 is connected to a column readout line $6_k$ for providing a pixel output signal (pout) for the pixel 200 on the column readout line $6_k$. Thus, the pixel 200 is controlled with the four control signals AB, TX, RST, and ROW, and the pixel 200 provides the output signal (pout).

With reference to FIGS. 1 and 2, in various embodiments each pixel 200 in the pixel array 2 receives the corresponding transfer gate control signal TX, anti-blooming gate control signal AB, reset control signal RST, and row select control signal ROW from the row driver 4 over the corresponding row control lines for the row in which the pixel 200 is located, such as the row control lines $5_1$ for the first row, the row control lines $5_2$ for the second row, and the row control lines $5_r$ for the $r^{th}$ row in the pixel array 2. In various embodiments, the column readout line $6_k$ for each pixel 200 in the pixel array 2 is the corresponding column readout line in the pixel array 2 for the column in which the pixel 200 is located, such as the column readout line $6_1$ for the first column, the column readout line $6_2$ for the second column, and the column readout line $6_m$ for the $m^{th}$ column of the pixel array 2.

An operation of the pixel 200 can be understood from the potential diagram shown in FIG. 3. With reference to FIGS. 1, 2, and 3, the potential profile 300 includes a level 302 that corresponds to an anti-blooming drain bias of the charge drain 209. A level 303 is determined by a bias of the anti-blooming gate 212. As electrons 320 accumulate in a photodiode well 305 created in the photodiode 219, a level 306 determined by the electrons 320 in the photodiode 219 rises. The level 303 determined by the bias of the anti-blooming gate 212 sets the level at which the electrons 320 that have accumulated in the photodiode well 305 start to overflow into the charge drain 209 that is at the level 302, and such overflow of electrons 320 is illustrated by the arrow 321. Such overflow of the electrons 320 from the photodiode 219 into the charge drain 209 after the level 306 exceeds the level 303 determined by the bias of the anti-blooming gate 212 prevents charge from spilling into neighboring pixels when any particular pixel 200 is illuminated by a high intensity light source.

When it is necessary to reset the photodiode 219 by removing all charge from it, the anti-blooming gate 212 is biased high by controlling the anti-blooming gate control signal AB, resulting in the potential level under the anti-blooming gate 212 changing to level 301 from the level 303. When the potential level under the anti-blooming gate 212 is changed to level 301, the electrons 320 in the photodiode 219 then flow from the photodiode well 305 into the charge drain 209 at the level 302. After resetting the photodiode 219, the anti-blooming gate 212 is controlled by controlling the anti-blooming gate control signal AB to be a voltage that results in the potential level under the anti-blooming gate 212 changing back to level 303 from the level 301. Thus, the potential level under the anti-blooming gate 212 is controllable between the levels 303 and 301 by controlling the bias applied to the anti-blooming gate 212 by the anti-blooming gate control signal AB.

The charge integration well of the photodiode 219 is bounded on one side by the anti-blooming barrier when the anti-blooming barrier is at the level 303, and the charge integration well of the photodiode 219 is bounded on the other side by a potential of a transfer gate barrier positioned at a level 310 that is created due to the barrier implant 211 when the transfer gate 204 is biased at a low biasing condition, or at a level 327 that is created due to the barrier implant 211 when the transfer gate 204 is biased at an intermediate biasing condition. In various embodiments, the biasing condition of the transfer gate 204 is controllable among the low biasing condition, the intermediate biasing condition, and a high biasing condition in accordance with a voltage level of the transfer gate control signal TX provided to the transfer gate 204. When a voltage is applied to the transfer gate 204 by the transfer gate control signal TX to bias the transfer gate 204, a potential well 326 is formed in the area 221 of the epitaxial layer 203 under the transfer gate 204. The level of the potential well 326 depends on the voltage applied to the transfer gate 204. Applying a voltage to the transfer gate 204 makes a depleted region in the area 221 under the transfer gate 204 that makes the potential well 326, and electrons are then attracted to the potential well 326 and accumulate there.

When the transfer gate 204 is biased high, the transfer gate barrier is lowered from the level 310 to a level 309, and electrons 322 from the photodiode well 305 flow (as illustrated by the arrow 323) into the potential well 326 under the transfer gate 204 that is at a potential level 308. Electrons 322 from the photodiode 219 then fill the potential well 326 under the transfer gate 204 to a level 313 and remain stored in the potential well 326 even after the bias of the transfer gate 204 is lowered to its starting intermediate biasing condition and the potential of the potential well 326 changes to a level that is a level 307 with a deviation from the level 307 due to any stored electrons. The electrons 322 are at that time confined in the potential well 326 under the transfer gate 204 by the transfer gate barrier at the level 327, and by a pinned barrier at a potential level 312. The transfer gate barrier at the level 327 is created due to the barrier implant 211 when the transfer gate 204 is biased in the intermediate biasing condition, and the pinned barrier at the level 312 is created due to the pinned charge transfer barrier 220.

When the image sensor 1 is operated in a global shutter mode, the transfer of charge in each pixel 200 in the pixel array 2 from the photodiode 219 of the pixel 200 to the potential well 326 under the transfer gate 204 of the pixel 200 is made simultaneously for all the pixels 200 of the pixel array 2 at a same time. The row driver 4 controls the pixels 200 in the pixel array 2 to transfer charge by controlling the transfer gate control signal TX in each row of the pixel array 2. Charge can then be transferred from the potential well 326 under the transfer gate 204 in each pixel 200 to the corresponding floating diffusion 208 for readout in a sequential mode row by row in the pixel array 2. It is also possible to transfer charge from the photodiode 219 to the potential well 326 under the transfer gate 204 for each pixel 200 in a row by row fashion in the pixel array 2 and then immediately to the corresponding floating diffusion 208 for readout when it is desirable to operate the image sensor 1 in a rolling shutter mode.

Charge is transferred from the potential well 326 under the transfer gate 204 in each pixel 200 to the corresponding floating diffusion 208 over the pinned charge transfer barrier 220 that is at the potential level 312 when the bias of the transfer gate 204 is lowered to its minimum biasing condition. That transfer gate bias change results in the potential of the potential well 326 under the transfer gate 204 being lowered to a level 311, which causes the electrons 322 to flow (as shown by the arrow 325) over the pinned charge transfer barrier 220 at the level 312 to the floating diffusion 208 that is a charge detection node. When the charge transfer from the potential well 326 under the transfer gate 204 is completed, the potential of the corresponding floating diffusion 208 changes from its reset level 314 to its signal level 315. This change is sensed by the source follower transistor 216 and detected by the corresponding column readout circuit 8 that is the signal processing circuitry located at the periphery of the pixel array 2. The column readout circuits 8 perform a Correlated Double Sampling (CDS) operation, which consists of sampling the potential of the floating diffusion 208 prior to charge transfer and again after the charge transfer and providing the difference between those two samples. The CDS operation for each pixel 200 is advantageous in removing any kTC reset noise from the signal and in removing any other pixel to pixel non-uniformity that may be encountered in the signal path from the pixel 200 to the corresponding column readout circuit 8 that is the array peripheral processing circuit. A level 316 is shown in FIG. 3 as being at zero potential in the area next to the floating diffusion 208.

An example of operation of the pixel 200 is now described with reference to FIGS. 1, 2, and 3. At the beginning of the operation cycle, the anti-blooming gate control signal AB applied to the anti-blooming gate 212 is controlled such that the potential level under the anti-blooming gate changes to level 301, and all charge from the photodiode 219 is drained out into the charge drain 209 at the level 302. When an image capture is initiated for the pixel 200, the anti-blooming gate control signal AB is controlled such that the potential level under the anti-blooming gate changes to level 303, and the transfer gate control signal TX is controlled to place the transfer gate 204 in the low biasing condition or in the intermediate biasing condition, such that the potential of the transfer gate barrier that is created due to the barrier implant 211 is either at the level 310 for the low biasing condition or the level 327 for the intermediate biasing condition. At that time, charge is collected during exposure cycle in the photodiode 219. If the charge level in the photodiode 219 passes the level 303 set by the anti-blooming gate 212, then excess charge is skimmed from the photodiode 219 by overflowing into the charge drain 209 at the level 302.

The transfer of charge from the photodiode 219 to under the transfer gate 204 is then performed by controlling the transfer gate control signal TX to place the transfer gate 204 in the high biasing condition, such that the potential well 326 in the area 221 under the transfer gate 204 changes to the level 308, and the potential of the transfer gate barrier that is created due to the barrier implant 211 changes to the level 309. The charge from the photodiode 219 at that time is then transferred to the potential well 326 in the area 221 under the transfer gate 204.

After the transfer to the potential well 326 is completed, the transfer gate control signal TX is controlled to place the transfer gate 204 in the intermediate biasing condition, such that the potential of the transfer gate barrier that is created due to the barrier implant 211 is at the level 327 and the potential of the potential well 326 changes to a level that deviates from the level 307 depending on the amount of charge in the potential well 326. At that time, a new exposure cycle in the photodiode 219 can start, controlled by the anti-blooming gate control signal AB. The anti-blooming gate control signal AB can be controlled such that the potential level under the anti-blooming gate changes to level 301 to cause charge to be drained from the photodiode 219, and then exposure cycle starts by controlling the anti-blooming gate control signal AB such that the potential level under the anti-blooming gate changes to level 303. A shutter shield 214, which is a p-type doped buried channel, serves as a barrier for protecting the potential well 326 from photoelectrons coming up from deep in the substrate 201 during the next exposure of the photodiode 219.

The readout of charge from the pixel 200 is performed in parallel with the exposure cycle that collects charge for the subsequent readout. Prior to transferring charge to the floating diffusion 208, the floating diffusion 208 is cleared of all charge either with a reset pulse by controlling the reset control signal RST to the gate of the reset transistor 215 to be HIGH and then LOW, or the floating diffusion 208 remains empty from a previous readout of charge from the floating diffusion 208. When the floating diffusion 208 is reset, it has a potential that is at the reset level 314. The transfer of charge from the potential well 326 under the transfer gate 204 to the floating diffusion 208 is then performed by controlling the transfer gate control signal TX applied to the transfer gate 204 such that the potential of the potential well 326 is changed to level 311 and all charge is transferred from the potential well 326 over the pinned barrier at the potential level 312 to the floating diffusion 208.

The readout from the pixel 200 can start right after the transfer of charge from the potential well 326 to the floating diffusion 208. To perform the readout from the pixel 200, the row select control signal ROW is controlled to be HIGH, and a pixel signal corresponding to the signal level 315 of charge at the floating diffusion 208 is read out over the column readout line $6_k$. The row select control signal ROW is then controlled to be LOW, and the reset control signal RST is controlled to be HIGH to reset the floating diffusion 208. The reset control signal RST is then controlled to be LOW and the row select control signal ROW is controlled to be HIGH to read out of potential (the reset value) of the empty floating diffusion 208 over the column readout line $6_k$.

The pixel signal corresponding to charge at the floating diffusion 208 prior to reset and the reset value corresponding to the reset potential at the floating diffusion 208 after the reset are provided to a corresponding column readout circuit 8 for the column of the pixel array 2 in which the pixel 200 is located. The column readout circuit 8 digitizes a difference between the pixel signal and the signal of the reset potential to provide a digital output representing the charge collected by the pixel 200 during the corresponding exposure.

Thus, in various embodiments, the pixel 200 includes the transfer gate 204 that is controllable among at least three biasing conditions, including a first biasing condition in which electrons 322 are transferable from a photodiode 219 to a potential well 326 under the transfer gate 204, a second biasing condition in which the electrons 322 are confined in the potential well 326 under the transfer gate 204, and a third biasing condition in which the electrons 322 are transferable out of the potential well 326 under the transfer gate 204.

In various embodiments, the transfer gate 204 is controllable to be in the second biasing condition when a voltage of a particular voltage level is applied to the transfer gate 204 by the transfer gate control signal TX, and the transfer gate 204 is controllable to be in the first biasing condition when a voltage at a level higher than the particular voltage level is applied to the transfer gate 204 by the transfer gate control signal TX, and the transfer gate 204 is controllable to be in the third biasing condition when a voltage at a level lower than the particular voltage level is applied to the transfer gate 204 by the transfer gate control signal TX. In various embodiments, the transfer gate control signal TX is controlled by the row driver 4. In some embodiments, the transfer gate 204 is in the first biasing condition if a voltage of 3.3 V or higher is applied to the transfer gate 204 by the transfer gate control signal TX, the transfer gate 204 is in the second biasing condition if a voltage of 1 V is applied to the transfer gate 204 by the transfer gate control signal TX, and the transfer gate 204 is in the third biasing condition if a voltage of 0 V or lower is applied to the transfer gate 204 by the transfer gate control signal TX. Of course, those voltage values are merely provided as examples, and in various other embodiments, other suitable voltage levels can be used to control the transfer gate 204.

In some embodiments, the pixel 200 includes the barrier implant 211 that is a p+ type implant located at least partially under a portion of the transfer gate 204, and the pixel 200 also includes the pinned charge transfer barrier 220 located on an opposite side of the transfer gate 204 from the photodiode 219, where the pinned charge transfer barrier 220 comprises the p+ type doped region 207 and the n-type doped region 213. In various embodiments, the barrier implant 211 is configured such that if the transfer gate 204 is controlled to be in the first biasing condition, a potential level of the transfer gate barrier provided by the barrier implant 211 is set, such as at the level 309, to allow the electrons 322 from the photodiode 219 to flow (as shown by the arrow 323) into the potential well 326 under the transfer gate 204.

In some embodiments, the barrier implant 211 and the pinned charge transfer barrier 220 are configured such that if the transfer gate 204 is controlled to be in the second biasing condition, the electrons 322 are confinable in the potential well 326 under the transfer gate 204 due to a potential level of the transfer gate barrier provided by the barrier implant 211, which is at the level 327, and a potential level of the pinned charge transfer barrier 220, which is at the level 312. Also, in some embodiments, the pinned charge transfer barrier 220 is configured such that if the transfer gate 204 is controlled to be in the third biasing condition, a potential level of the pinned charge transfer barrier 220, such as the level 312, allows the electrons 322 to be transferred (as shown by the arrow 325) from the potential well 326 under the transfer gate 204 to the floating diffusion 208 that is on an opposite side of the pinned charge transfer barrier 220 from the potential well 326 under the transfer gate 204.

In various embodiments, the pixel 200 includes the epitaxial layer 203 located at least partially under the transfer gate 204, and the barrier implant 211 is located in the epitaxial layer 203 at least partially under a portion of the transfer gate 204. In various embodiments, the epitaxial layer 203 is a p-type layer. In various embodiments, the pixel 200 includes the pinned charge transfer barrier 220 located on an opposite side of the transfer gate 204 from the photodiode 219, and the pinned charge transfer barrier 220 includes the p+ type doped region 207 and the n-type doped region 213. In some embodiments, the pixel 200 includes the floating diffusion 208, and the pinned charge transfer barrier 220 interfaces with the floating diffusion 208. In some embodiments, the floating diffusion 208 is formed from an n+ type doped region.

In various embodiments, the image sensor 1 includes the pixel array 2 with the plurality of pixels 200, and each pixel 200 in the pixel array 2 includes the transfer gate 204 that is controllable among the first biasing condition in which the electrons 322 are transferable (as shown by the arrow 323) from the corresponding photodiode 219 to the potential well 326 under the transfer gate 204, the second biasing condition in which the electrons 322 are confinable in the potential well 326 under the transfer gate 204, and the third biasing condition in which the electrons 322 are transferable (as shown by the arrow 325) out of the potential well 326 under the transfer gate 204.

In some embodiments, the pixel array 2 is controllable by the row driver 4 to operate in a global shutter mode in which the transfer gate 204 of each pixel 200 in the pixel array 2 is simultaneously for all the pixels in the array in the first biasing condition so as to transfer charge at a same time and then simultaneously in the second biasing condition to store charge. Also, in some embodiments, the pixel array 2 is controllable by the row driver 4 in the global shutter mode to have the transfer gate 204 of each pixel 200 in a row of the pixel array 2 placed in the third biasing condition at a same time, so as to transfer charge for read out. In some embodiments, the pixel array 2 is controllable by the row driver 4 to operate in a rolling shutter mode in which the transfer gate 204 of each pixel 200 in a row of the pixel array 2 is placed in the first biasing condition and then in the third biasing condition and then at a different time each pixel 200 in another row of the pixel array 2 is placed in the first biasing condition and then in the third biasing condition.

In various embodiments, other layouts are possible for the image sensor 1 and the pixel array 2. For example, in various embodiments, the pixel array 2 may have more than one readout line for each column such that more than one row can be read out at a same time. Also, in various embodiments, there may be column readout circuitry on both the top and the bottom of the pixel array 2, so that some signals can be read out to the top of the pixel array 2 and some signals to the bottom of the pixel array 2. In some embodiments, there may be more than one row driver, and the row drivers may drive control signals at a same time to the pixel array.

Figure 4:
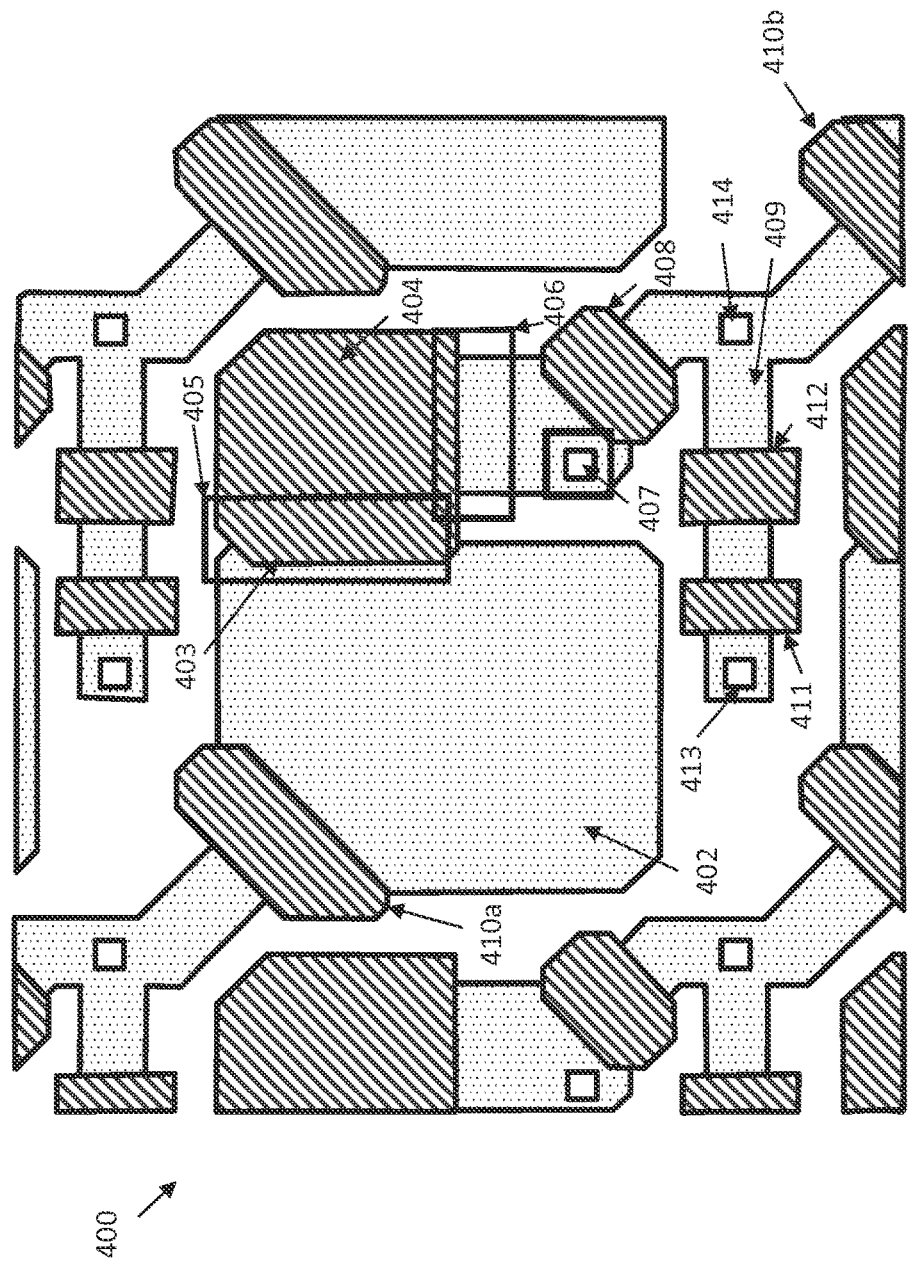
FIG. 4 shows a pixel topology in accordance with an embodiment with a photodiode, a transfer gate, a pinned charge transfer barrier, a floating diffusion node, an anti-blooming structure, and pixel circuit transistors.

FIG. 4 shows an embodiment of a layout 400 of the pixel 200 of FIG. 2. With reference to FIGS. 2, 3, and 4, the pixel layout 400 is a simplified layout topology of the pixel 200 that has the global shutter operation capability. The diffusion node contact 414 allows for connecting to metal wiring. Active regions are shown in the layout 400 as dotted areas, and Poly silicon areas are shown in the layout 400 as areas with diagonal lines. The photodiode 219 is shown in the layout 400 as the region 402, and the transfer gate 204 is shown as the region 403. The transfer gate barrier created by the barrier implant 211 is illustrated in the layout 400 as the region 405, and the potential well 326 under the transfer gate 204 is under the region 404 in the layout 400. The pinned charge transfer barrier 220 is shown in the layout 400 as the region 406.

An area of the floating diffusion 208 is shown in the layout 400 as the region 407. The gate of the reset transistor 215 is shown in the layout 400 as the region 408. The anti-blooming gate 212 is shown in the layout 400 as the region 410a. The gate of the source follower transistor 216 is shown in the layout 400 as the region 412. A drain region 409 is bounded by the reset transistor gate region 408, the source follower transistor gate region 412, and an anti-blooming gate region 410b of another pixel in the pixel array that is located one row below and one column over (i.e., diagonally) in the pixel array. The pixel addressing transistor gate, which is the gate of the row select transistor 218 is shown in the layout 400 as the region 411, and the pixel signal output (pout) appears at the source 413 of the row select transistor 218. This particular layout example has an advantage of a short connection between the source follower transistor gate region 412 and the floating diffusion region 407. This may provide an advantage of higher pixel sensitivity and a low feed through from any undesirable couplings to various pixel wiring.

FIG. 5 shows a simplified cross sectional view of another embodiment of a pixel 500 in which a barrier implant 511 under the transfer gate 204 is constructed symmetrically for both the transfer gate 204 and the anti-blooming gate 212. With reference to FIGS. 2 and 5, except for the length of the barrier implant 511 being different from the length of the barrier implant 211, the pixel 500 is the same as the pixel 200, and like elements of those pixels are labeled with the same reference numbers in both figures. The barrier implant 511, which is a p+ type implant, spans from under a portion of the transfer gate 204, across a length of the photodiode 219, and under a portion of the anti-blooming gate 212.

Thus, in some embodiments, the pixel 500 includes the p+ type doped implant 205 and the n-type doped implant 206 that form the photodiode 219, and the p+ type barrier implant 511 extends at least partially into the photodiode 219. In some embodiments, the pixel 500 further includes the anti-blooming gate 212, and a portion of the p+ type barrier implant 511 is located at least partially under a portion of the anti-blooming gate 212. Also, in some embodiments, the anti-blooming gate 212 is located on an opposite side of the photodiode 219 from the transfer gate 204, and the p+ type barrier implant 511 extends from under the portion of the transfer gate 204 across a length of the photodiode 219 to under the portion of the anti-blooming gate 212. In various embodiments, the p+ barrier implant 511, which forms the transfer gate barrier, is implanted before poly deposition using a shallow BF2 implant. The mask used for the p+ barrier implant 511 in various embodiments is used again after the poly deposition to form the n-type doped implant 206 layer. The pixel 500 can be used, for example, in place of the pixel 200 in the pixel array 2 of FIG. 1.

FIG. 6 shows a simplified potential profile 600 corresponding to the embodiment of the pixel 500 shown in FIG. 5. The potential profile 600 of FIG. 6 is similar to the potential profile 300 of FIG. 3 except for the part of the profile corresponding to the region under the anti-blooming gate. The parts of the profile 600 that are the same as the profile 300 are labeled with the same reference numbers. With reference to FIGS. 5 and 6, a level 603 and a level 604 are determined by a bias of the anti-blooming gate 212. The level 604 differs from the level 603 due to the barrier implant 511 under a portion of the anti-blooming gate 212 that causes the level 604. As electrons 620 accumulate in the photodiode well 305 created in the photodiode 219, a level 306 determined by the electrons 620 in the photodiode 219 rises. The level 604 determined by the bias of the anti-blooming gate 212 sets the level at which the electrons 620 that have accumulated in the photodiode well 305 start to overflow into the charge drain 209 that is at the level 302, and such overflow of electrons 620 is illustrated by the arrow 621. Such overflow of the electrons 620 from the photodiode 219 into the charge drain 209 after the level 306 exceeds the level 604 determined by the bias of the anti-blooming gate 212 prevents charge from spilling into neighboring pixels when any particular pixel 500 is illuminated by a high intensity light source.

When it is necessary to reset the photodiode 219 by removing all charge from it, the anti-blooming gate 212 is biased high by controlling the anti-blooming gate control signal AB, resulting in the potential level under the anti-blooming gate 212 changing to a level 601 and a level 617 from the level 603 and the level 604, respectively. The level 617 differs from the level 601 due to the barrier implant 511 under a portion of the anti-blooming gate 212 that causes the level 617. When the potential level under the anti-blooming gate 212 is changed to level 601 and level 617, the electrons 620 in the photodiode 219 then flow from the photodiode well 305 into the charge drain 209 at the level 302. After resetting the photodiode 219, the anti-blooming gate 212 is controlled by controlling the anti-blooming gate control signal AB to be at a voltage that results in the potential level under the anti-blooming gate 212 changing back to the level 603 and the level 604 from the level 601 and the level 617, respectively. Thus, the potential level under the anti-blooming gate 212 is controllable by controlling the bias applied to the anti-blooming gate 212 by the anti-blooming gate control signal AB. The barrier at level 310 under the transfer gate 204 and the barrier at level 604 under the anti-blooming gate 212 are formed in the areas which are adjacent to the photodiode 219.

FIG. 7 shows a cross sectional view of another embodiment of a pixel 700 that is similar to the pixel 200 described in FIG. 2, but with the addition of a buried channel 717, and like elements of those pixels are labeled with the same reference numbers in both figures. With reference to FIGS. 2 and 7, the pixel 700 includes a charge drain 709 that is similar to the charge drain 209 but is deeper, the pixel 700 includes an n-type doped region 713 of a pinned charge transfer barrier 720 that is similar to the n-type doped region 213 of the pinned charge transfer barrier 220 but is located deeper in the silicon bulk, pixel 700 includes a floating diffusion 708 that is similar to the floating diffusion 208 but is located deeper in the silicon bulk. The buried channel 717 spans a region under the transfer gate 204, a region under the anti-blooming gate 212, and an area that includes the pinned charge transfer barrier 720 and the floating diffusion 708.

Thus, in some embodiments, the pixel 700 includes the buried channel 717 that at least spans a distance from the floating diffusion 708 across a portion of the pinned charge transfer barrier 720, under the transfer gate 204, across a length of the photodiode 219, and under the anti-blooming gate 212. In some embodiments, the buried channel 717 comprises an n-type doped region. The pixel 700 can be used, for example, in place of the pixel 200 in the pixel array 2 of FIG. 1.

FIG. 8 shows a simplified potential profile 800 corresponding to the embodiment of the pixel 700 shown in FIG. 7. The potential profile 800 of FIG. 8 has a same shape as the potential profile 300 of FIG. 3, but there is a level shift in all the areas where the buried channel 717 is located, because the buried channel 717 provides, for example, a one-half volt level change to all areas where it is located.

Figure 9A:
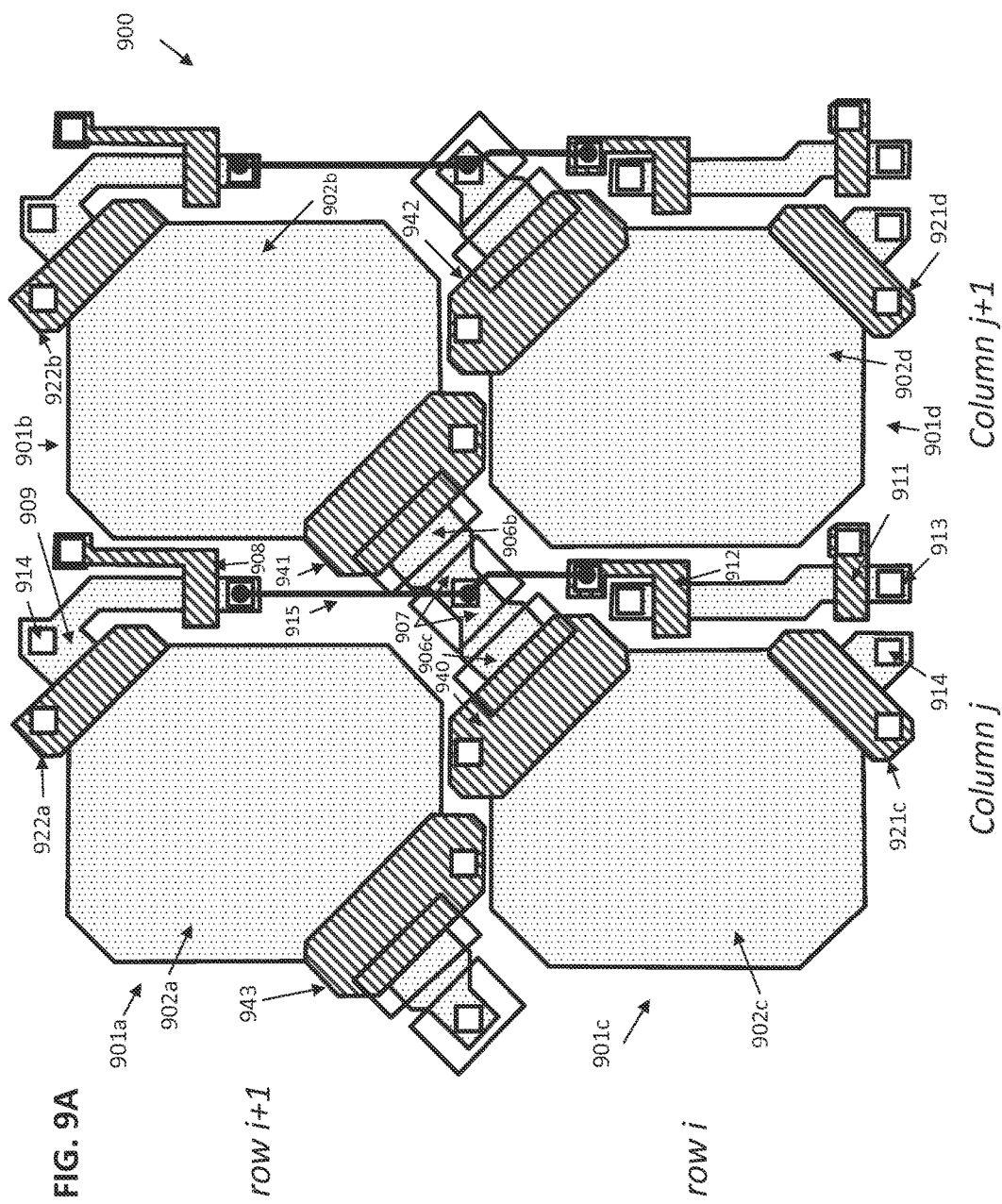
FIG. 9A is an example of a portion of an embodiment of a pixel array showing the topology of an array of 2×2 pixels where a floating diffusion, a source follower, and a reset transistor are shared between two diagonal neighbor pixels.

FIG. 9A shows a simplified topology drawing of a portion of a pixel array 900 in accordance with an embodiment. The portion of the pixel array 900 shown in FIG. 9A is a 2×2 pixel sub array, and the 2×2 pixel sub array can be replicated and a plurality of the 2×2 pixel sub arrays can form an entire pixel array. Active regions in the pixel array 900 are shown as dotted areas, and Poly silicon areas in the pixel array 900 are shown as areas with diagonal lines. The pixel array 900 includes a pixel 901a, a pixel 901b, a pixel 901c, and a pixel 901d. The pixel 901a is in a row i+1 and a column j of the pixel array 900. The pixel 901b is in the row i+1 and a column j+1 of the pixel array 900. The pixel 901c is in a row i and the column j of the pixel array 900. The pixel 901d is in the row i and the column j+1 of the pixel array 900. The pixel 901a includes a photodiode 902a, a transfer gate 943, an anti-blooming gate 922a, and a drain 909. The pixel 901b includes a photodiode 902b, a transfer gate 941, a pinned charge transfer barrier 906b, and an anti-blooming gate 922b. The pixel 901c includes a photodiode 902c, a transfer gate 940, a pinned charge transfer barrier 906c, and an anti-blooming gate 921c. The pixel 901d includes a photodiode 902d, a transfer gate 942, and an anti-blooming gate 921d.

In the pixel array 900, a floating diffusion node 907, a source follower transistor 912, a row select transistor 911, and a reset transistor 908 are shared between the pixel 901b and the pixel 901c, which are two diagonal neighboring pixels in the pixel array 900. The pixel 901c is located at the row i and the column j, and the pixel 901b is located at the row i+1 and the column j+1. The transfer gate 940, the transfer gate 941, the pinned charge transfer barrier 906c, and the pinned charge transfer barrier 906b transfer charge to the shared floating diffusion 907, which is connected using a metal wire 915 to the shared reset transistor 908 and to the shared source follower transistor 912. The row select transistor 911 is also shared between the pixel 901c (in row i, column j) and the pixel 901b (in row i+1, column j+1). The output from each of the pixels 901*b* and 901*c* is obtained from the source follower transistor 912 through the row select transistor 911 that has a terminal 913. The drawing in FIG. 9A also shows contacts 914 to diffusion areas, and contacts to the Poly areas, but the corresponding metal wiring connections are for simplicity not shown in FIG. 9A.

Figure 9B:
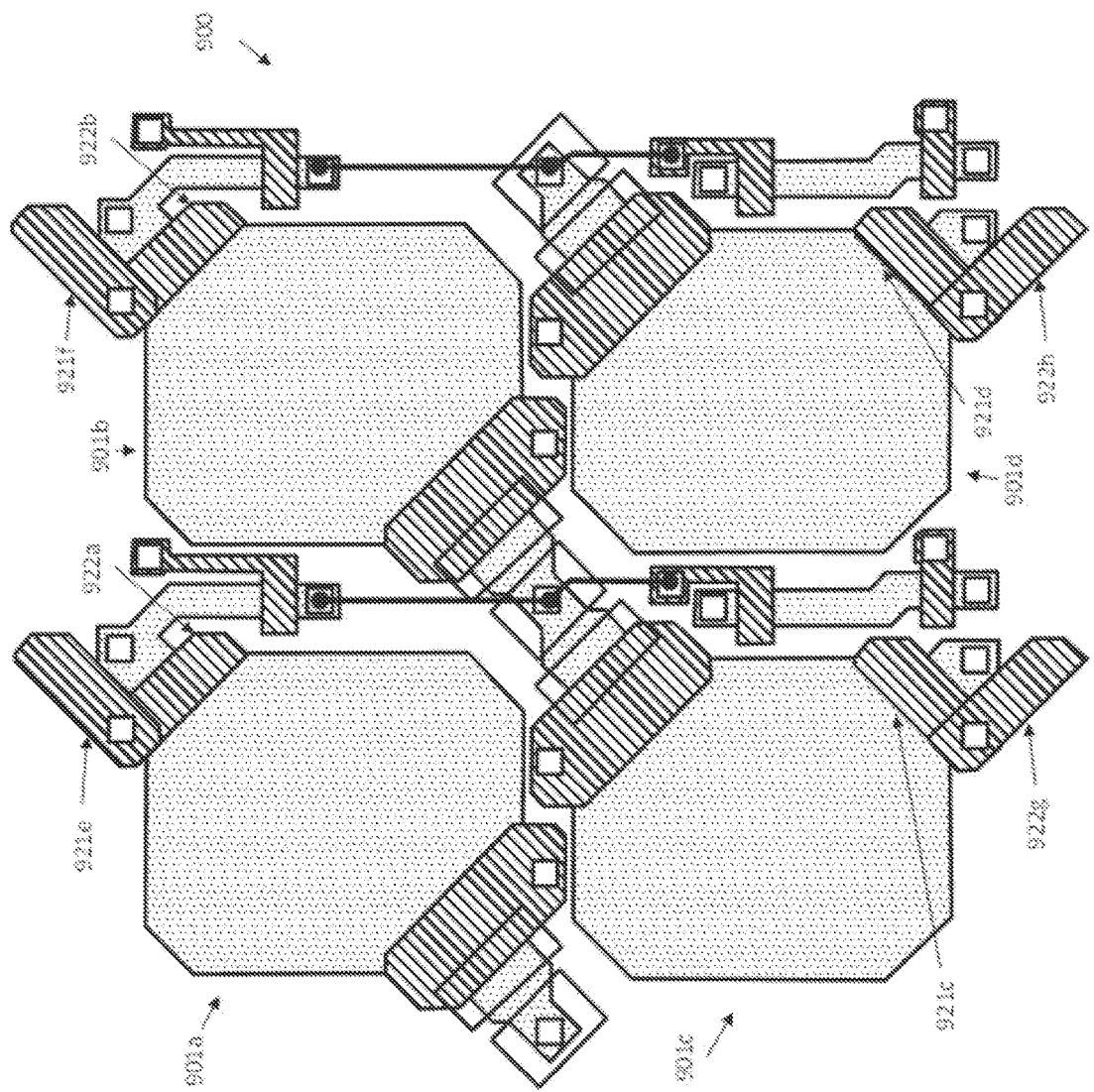
FIG. 9B is an embodiment of the pixel array of FIG. 9A and shows the sharing of anti-blooming gates between pixels in odd rows and pixels in even rows of the pixel array.

In this topology, the anti-blooming gates 921*c* and 921*d* belonging to row i are connected to anti-blooming gates of a previous row i−1, and, similarly, the anti-blooming gates 922*a* and 922*b* of the row i+1 share the connection and the control with anti-blooming gates of a row i+2. FIG. 9B shows an embodiment of the pixel array 900 with the sharing of anti-blooming gates among rows. The anti-blooming gate 921*c* belonging to row i is connected to anti-blooming gate 922*g* of a previous row i−1. The anti-blooming gate 921*d* belonging to row i is connected to anti-blooming gate 922*h* of a previous row i−1. The anti-blooming gate 922*a* belonging to row i+1 is connected to anti-blooming gate 921*e* of a next row i+2. The anti-blooming gate 922*b* belonging to row i+1 is connected to anti-blooming gate 921*f* of a next row i+2. In various embodiments, because the transfer gates 940 and 941 transfer charge to the same shared floating diffusion 907, they have separate controls. The transfer gates 940 and 942, on the other hand, belong to the same row i and thus can be connected together and operated by a same controlling signal. Similarly, the transfer gates 943 and 941 can be connected together and to another controlling line. With reference to FIGS. 2, 9A, and 9B, in various embodiments the pixels 901*a*, 901*b*, 901*c*, and 901*d* each include a barrier implant such as the barrier implant 211 under a portion of each of the transfer gates 943, 941, 940, and 942. Also, in various embodiments, the pixels 901*a*, 901*b*, 901*c*, and 901*d* operate in a similar manner as the pixel 200.

Thus, in various embodiments, the pixel array 900 includes the source follower transistor 912 connected to at least two pixels 901*b* and 901*c* for reading out charge from each of the at least two pixels 901*b* and 901*c*. In some embodiments, the pixel array 900 includes the floating diffusion 907 that is shared among the at least two pixels 901*b* and 901*c* for receiving charge from the potential well under the transfer gate 941 and 940 of each of the at least two pixels 901*b* and 901*c*, respectively. Also, in some embodiments, the pixel array 900 includes the reset transistor 908 that is connected to the floating diffusion 907 and that is shared among the at least two pixels 901*b* and 901*c*.

In various embodiments, the pixel array 900 includes the source follower transistor 912 connected to the at least two pixels 901*b* and 901*c* for reading out charge from each of the at least two pixels 901*b* and 901*c*, the floating diffusion 907 that is shared among the at least two pixels 901*b* and 901 *c* for receiving charge from the potential well under the corresponding transfer gates 941 and 940, the reset transistor 908 that is connected to the floating diffusion 907 and that is shared among the at least two pixels 901*b* and 901*c*, and the row select transistor 911, which is an addressing transistor connected to the source follower transistor 912 and that is shared among the at least two pixels 901*b* and 901*c*, where the at least two pixels 901*b* and 901*c* are positioned diagonal to each other in the pixel array 900. In some embodiments, the pixel array 900 includes one or more anti-blooming gates and drains that are shared among several pixels of the plurality of pixels. Also, in some embodiments, anti-blooming gates and drains of each even row of pixels in the pixel array are shared with a corresponding neighboring odd row of pixels in the pixel array.

Figure 10:
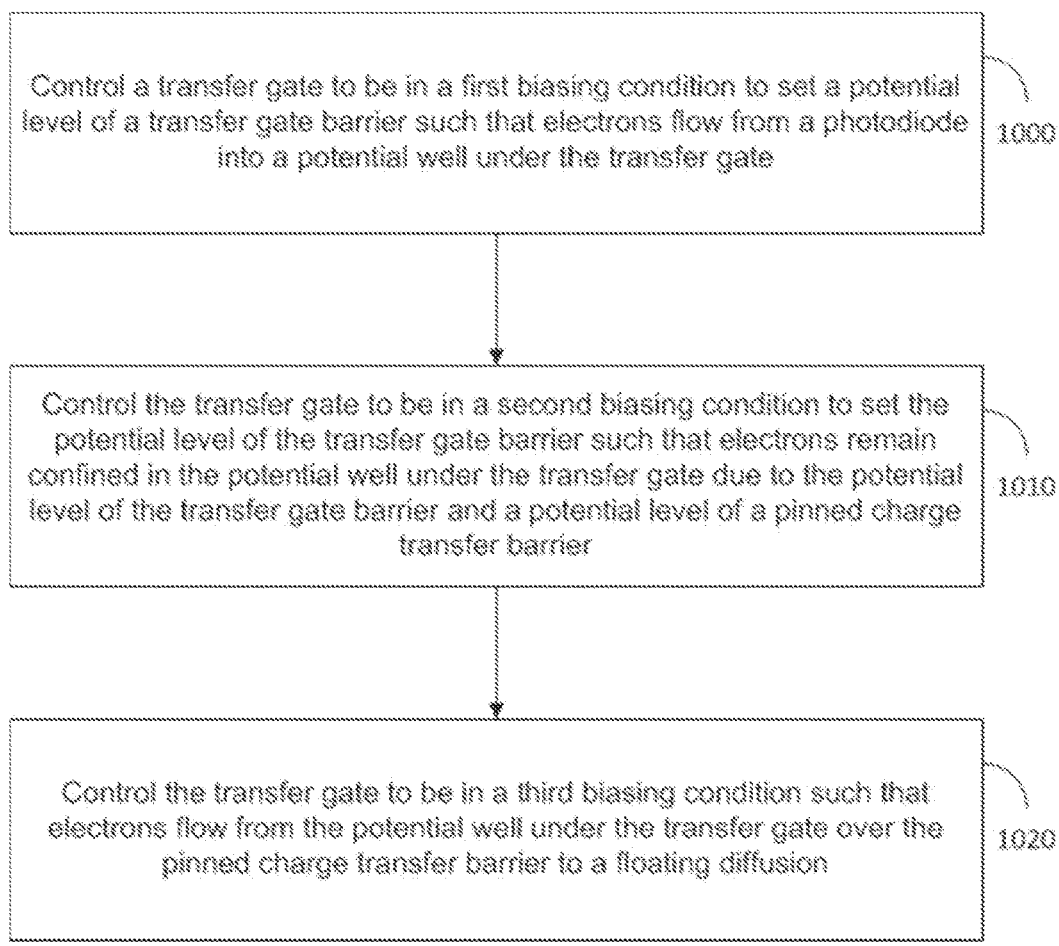
FIG. 10 shows a method of operating an image sensor in accordance with an embodiment.

FIG. 10 illustrates a method of operating an image sensor in accordance with an embodiment. In step 1000, a transfer gate is controlled to be in a first biasing condition to set a potential level of a transfer gate barrier such that electrons flow from a photodiode into a potential well under the transfer gate. The method then continues to step 1010. In step 1010, the transfer gate is controlled to be in a second biasing condition to set the potential level of the transfer gate barrier such that electrons remain confined in the potential well under the transfer gate due to the potential level of the transfer gate barrier and a potential level of a pinned charge transfer barrier. The method then continues to step 1020. In step 1020, the transfer gate is controlled to be in a third biasing condition such that electrons flow from the potential well under the transfer gate over the pinned charge transfer barrier to a floating diffusion charge detection node.

Figure 11A:
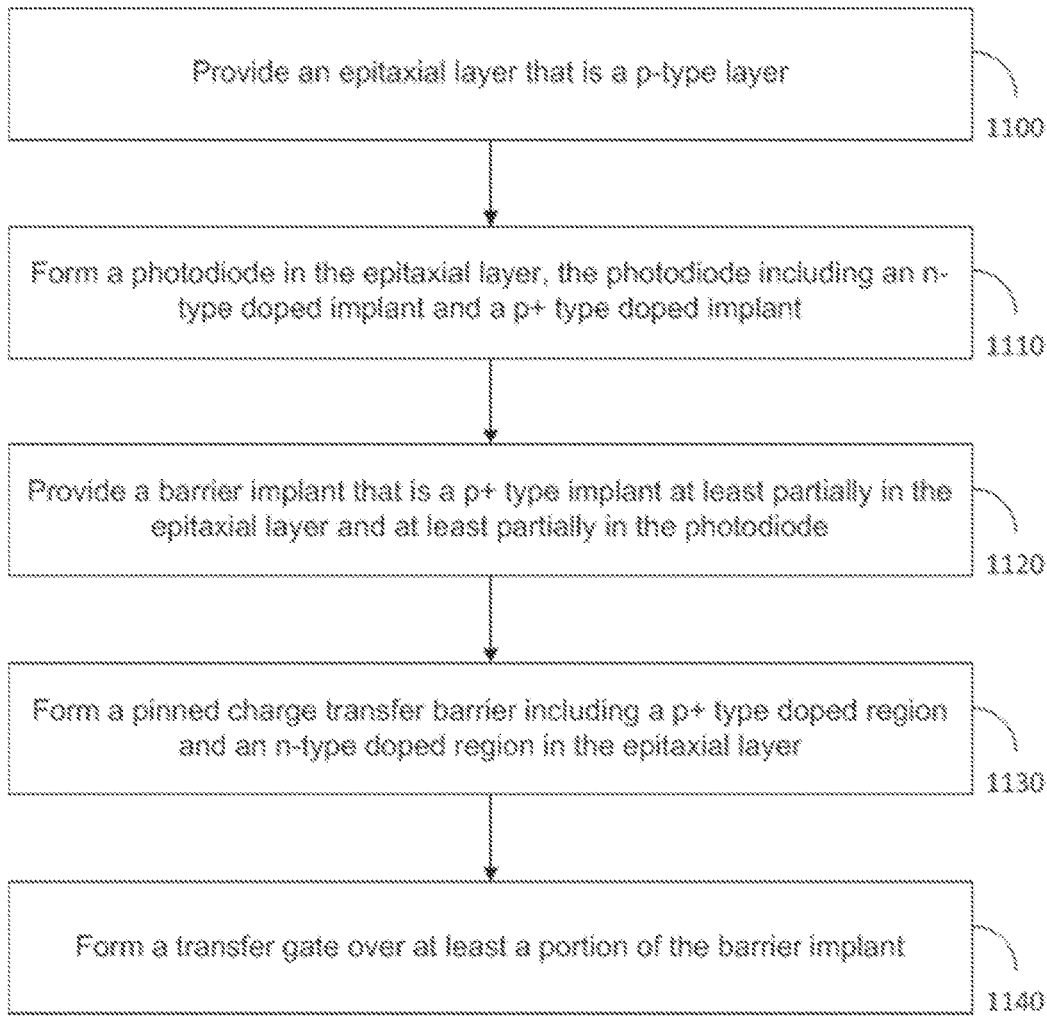
FIG. 11A shows a method of manufacturing a pixel in accordance with an embodiment.

FIG. 11A illustrates a method of manufacturing a pixel in accordance with an embodiment. With reference to FIGS. 2, 5, 7, and 11A, in step 1100 the epitaxial layer 203 is provided that is a p-type doped layer and the method continues to step 1110. In step 1110, the photodiode 219 is formed in the epitaxial layer 203, where the photodiode 219 includes the n-type doped implant 206 and the p+ type doped implant 205, and the method continues to step 1120. In step 1120, the barrier implant 211 or 511 is provided that is a p+ type doped implant at least partially in the epitaxial layer 203 and at least partially in the photodiode 219, and the method continues to step 1130. In step 1130, the pinned charge transfer barrier 220 is formed that includes the p+ type doped region 207 and the n-type doped region 213 in the epitaxial layer 203, and the method continues to step 1140. In step 1140, the transfer gate 204 is formed over at least a portion of the barrier implant 211 or 511.

Figure 11B:
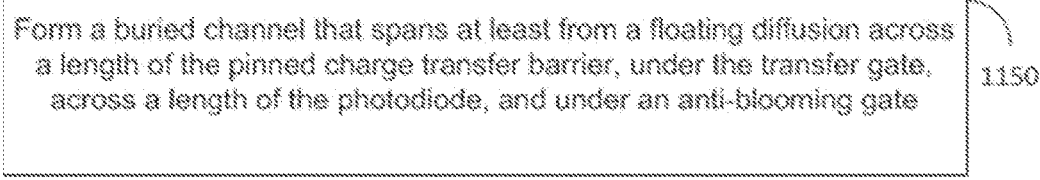
FIG. 11B shows a method of manufacturing a pixel that can be used along with the method of FIG. 11A.

In various embodiments, the pinned charge transfer barrier 220 is on the opposite side of the transfer gate 204 from the photodiode 219. In some embodiments, the pinned charge transfer barrier 220 is formed to interface with the floating diffusion 208. Also, in some embodiments, a portion of the barrier implant, such as the barrier implant 511, is formed to be under a portion of the anti-blooming gate 212. In various embodiments, the p+ implant for the barrier implant 511 is implanted before poly deposition using a shallow BF2 implant. FIG. 11B illustrates a step of a method that can be performed along with the method of FIG. 11A. With reference to FIGS. 7, 11A, and 11B, in various embodiments the method includes the step 1150 of forming the buried channel 717 that spans at least from the floating diffusion 708 across a portion of the pinned charge transfer barrier 720, under the transfer gate 204, across a length of the photodiode 219, and under the anti-blooming gate 212.

A CMOS image sensor pixel array in accordance with an embodiment includes at least one pixel circuit having a pinned photodiode, a pinned charge transfer barrier, a floating diffusion, a reset transistor, and a source follower transistor, and has also a transfer gate that can be operated between three biasing levels with the capability of storing charge. In some embodiments, the CMOS image sensor pixel array has a drain and an anti-blooming gate interfacing the photodiode, and the anti-blooming gate and drain are capable of removing all charge from the pixel, thereby resetting the photodiode. In various embodiments, the CMOS image sensor pixel array has a drain and an anti-blooming gate interfacing the photodiode, and the anti-blooming gate is adjusted to a specific bias level, thereby removing any overflow charge from the pixel photodiode.

In various embodiments, the CMOS image sensor pixel array is operated in a global shuttering mode by transferring image generated charge signals from the array photodiodes to array storage wells located under the pixel transfer gates simultaneously for all the pixels of the pixel array and reading the stored signal charge by transferring it from the transfer gate storage wells to floating diffusions sequentially in a row by row fashion. In some embodiments, the CMOS image sensor pixel array is operated in a rolling shuttering mode by transferring the image generated charge signals from the array photodiodes to the array storage wells located under the pixel transfer gates sequentially for all the pixels of the array and reading the stored signal charge by transferring it from the transfer gate storage wells to floating diffusions also sequentially in a row by row fashion.

In various embodiments, the CMOS image sensor array has pixels where the source follower transistor and the addressing transistors are shared among several pixels. In some embodiments, the CMOS image sensor array has floating diffusions that are shared among several pixels. In some embodiments, the CMOS image sensor array includes a reset transistor that is shared among several pixels. In various embodiments, the floating diffusion, the source follower transistor, the addressing transistor, and the reset transistor are shared between two pixels that are diagonal to each other in the pixel array.

In various embodiments, the anti-blooming gates and drains in the pixel array are shared among several pixels. Also, in various embodiments, the anti-blooming gates and drains of even rows in the pixel array are shared with the anti-blooming gates of the neighboring odd rows in the pixel array. In some embodiments, the pixel array has in its pixel circuitry an addressing transistor, such as a row select transistor. In some embodiments, the CMOS image sensor pixel array has color filters deposited on top of the pixels to facilitate color sensing. In some embodiments, the CMOS image sensor pixel array has micro-lenses deposited on the top of the pixels. In various embodiments, the CMOS image sensor pixel array has incorporated in the image sensor the circuits for the CDS signal processing and the circuits for the conversion of the analog signal to the digital equivalent for each column of the pixel array.

In various embodiments, an image sensor includes a pixel array comprising a plurality of pixels that each have architecture similar to the pixel illustrated in FIG. 2. In various embodiments, an image sensor includes a pixel array comprising a plurality of pixels that each has architecture similar to the pixel illustrated in FIG. 5. In various embodiments, an image sensor includes a pixel array comprising a plurality of pixels that each has architecture similar to the pixel illustrated in FIG. 7.

In various embodiments, an image sensor includes a pixel array comprising a plurality of pixels that have a layout as illustrated in FIG. 4. In various embodiments, an image sensor includes a pixel array comprising a plurality of pixels that have a layout as illustrated in FIG. 9A.

Having thus described various embodiments of novel pixels for image sensor arrays that have a global shuttering capability as well as a rolling shuttering capability, which is achieved by the transfer gate that can be operated in a tri-state biasing fashion, where the pixels have excellent anti-blooming capabilities, a compact size with high sensitivity, and a low dark current when operated at high speeds, which are intended to be illustrative and not limiting, it is noted that various modifications and variations could be made in light of the above teachings. It is therefore to be understood that changes may be made in the particular embodiments disclosed, which are within the scope and spirit of the invention.

An image sensor in accordance with various embodiments includes a pixel array with pixels that have global shutter and rolling shutter capabilities, and that use a transfer gate for charge storage. The transfer gate in various embodiments is controlled to operate between at least three different biasing levels. This feature allows for designing pixels that efficiently utilize the available pixel area, thus having high sensitivity and a high dynamic range, which is an advantage when, for example, image sensors are used in fast scanning applications. In various embodiments, fast sensor scanning does not allow accumulation of excessive dark current in the charge storage node of the pixels and thus does not significantly degrade image sensor noise performance.

CMOS image sensors in accordance with various embodiments provide global shuttering capability and/or rolling shutter capability, consume less pixel area, do not sacrifice pixel performance, and operate with low voltages. In various embodiments, a transfer gate is used for charge storage. In various embodiments, any potential large dark current generation at an interface between silicon and silicon-dioxide for a transfer gate may not be a problem when the pixel scanning in the row by row fashion is fast in high speed sensor applications. Also, various embodiments provide a CMOS image sensor design that has a small pixel size, can operate in a rolling shutter mode, as well as in a global shutter mode, with a low power supply voltage. In various embodiments, this is made possible by using a novel transfer gate structure that can store charge and can be operated among three bias levels.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. Various modifications and changes that come within the meaning and range of equivalency of the claims are intended to be within the scope of the invention.

What is claimed is:

1. A pixel, comprising:
   a transfer gate that is controllable among a first biasing condition in which electrons are transferable from a photodiode to a potential well under the transfer gate, a second biasing condition in which the electrons are confinable in the potential well under the transfer gate, and a third biasing condition in which the electrons are transferable out of the potential well under the transfer gate;
   a floating diffusion;
   a p+ type barrier implant located at least partially under a portion of the transfer gate; and
   a pinned charge transfer barrier located on an opposite side of the transfer gate from the photodiode, the pinned charge transfer barrier comprising a p+ type doped region and an n-type doped region;
   wherein the p+ type doped region of the pinned charge transfer barrier is located between an area for the potential well under the transfer gate and the floating diffusion.

2. The pixel of claim 1,
   wherein the p+ type barrier implant is configured such that if the transfer gate is controlled to be in the first biasing condition, a potential level of a transfer gate barrier provided by the p+ type barrier implant is set to allow electrons from the photodiode to flow into the potential well under the transfer gate.

3. The pixel of claim 1,
   wherein the floating diffusion comprises an n+ type region.

4. The pixel of claim 1, further comprising:
a source follower transistor including a gate that is connected to the floating diffusion.

5. A pixel, comprising:
a transfer gate that is controllable among a first biasing condition in which electrons are transferable from a photodiode to a potential well under the transfer gate, a second biasing condition in which the electrons are confinable in the potential well under the transfer gate, and a third biasing condition in which the electrons are transferable out of the potential well under the transfer gate;
a floating diffusion;
an epitaxial layer located at least partially under the transfer gate;
a p+ type barrier implant located in the epitaxial layer at least partially under a portion of the transfer gate; and
a pinned charge transfer barrier located on an opposite side of the transfer gate from the photodiode, the pinned change transfer barrier comprising a p+ doped region and an n-type doped region;
wherein the p+ doped region of the pinned charge transfer barrier is located between an area for the potential well under the transfer gate and the floating diffusion.

6. The pixel of claim 5, further comprising:
a p+ type doped implant and an n-type doped implant that form the photodiode;
wherein the p+ type barrier implant extends at least partially into the photodiode.

7. The pixel of claim 5, further comprising:
an anti-blooming gate;
wherein a portion of the p+ type barrier implant is located at least partially under a portion of the anti-blooming gate.

8. The pixel of claim 5,
wherein the floating diffusion comprises an n+ type region.

9. The pixel of claim 5, further comprising:
a source follower transistor including a gate that is connected to the floating diffusion.

10. A pixel, comprising:
a transfer gate that is controllable among a first biasing condition in which electrons are transferable from a photodiode to a potential well under the transfer gate, a second biasing condition in which the electrons are confinable in the potential well under the transfer gate, and a third biasing condition in which the electrons are transferable out of the potential well under the transfer gate;
a floating diffusion; and
a pinned charge transfer barrier located on an opposite side of the transfer gate from the photodiode, the pinned charge transfer barrier comprising a p+ type doped region and an n-type doped region;
wherein the p+ type doped region of the pinned charge transfer barrier is located between an area for the potential well under the transfer gate and the floating diffusion.

11. The pixel of claim 10,
wherein the pinned charge transfer barrier interfaces with the floating diffusion.

12. The pixel of claim 11,
wherein the floating diffusion comprises an n+ type doped region.

13. The pixel of claim 11, further comprising:
an anti-blooming gate; and
a buried channel that at least spans from the floating diffusion across a portion of the pinned charge transfer barrier, under the transfer gate, across a length of the photodiode, and under the anti-blooming gate.

14. The pixel of claim 13,
wherein the buried channel comprises an n-type doped region.

15. The pixel of claim 10, further comprising:
a source follower transistor including a gate that is connected to the floating diffusion.

16. A pixel comprising:
a transfer gate that is controllable among a first biasing condition in which electrons are transferable from a photodiode to a potential well under the transfer gate, a second biasing condition in which the electrons are confinable in the potential well under the transfer gate, and a third biasing condition in which the electrons are transferable out of the potential well under the transfer gate;
a p+ type barrier implant located at least partially under a portion of the transfer gate; and
a pinned charge transfer barrier located on an opposite side of the transfer gate from the photodiode, the pinned charge transfer barrier comprising a p+ type doped region and an n-type doped region;
wherein the p+ type barrier implant and the pinned charge transfer barrier are configured such that if the transfer gate is controlled to be in the second biasing condition, electrons are confinable in the potential well under the transfer gate due to a potential level of a transfer gate barrier provided by the p+ type barrier implant and a potential level of the pinned charge transfer barrier.

17. A pixel, comprising:
a transfer gate that is controllable among a first biasing condition in which electrons are transferable from a photodiode to a potential well under the transfer gate, a second biasing condition in which the electrons are confinable in the potential well under the transfer gate, and a third biasing condition in which the electrons are transferable out of the potential well under the transfer gate;
a p+ type barrier implant located at least partially under a portion of the transfer gate; and
a pinned charge transfer barrier located on an opposite side of the transfer gate from the photodiode, the pinned charge transfer barrier comprising a p+ type doped region and an n-type doped region;
wherein the pinned charge transfer barrier is configured such that if the transfer gate is controlled to be in the third biasing condition, a potential level of the pinned charge transfer barrier allows electrons to be transferred from the potential well under the transfer gate to a floating diffusion that is on an opposite side of the pinned charge transfer barrier from the potential well under the transfer gate.

18. A pixel, comprising:
a transfer gate that is controllable among a first biasing condition in which electrons are transferable from a photodiode to a potential well under the transfer gate, a second biasing condition in which the electrons are confinable in the potential well under the transfer gate, and a third biasing condition in which the electrons are transferable out of the potential well under the transfer gate;
a p-type epitaxial layer located at least partially under the transfer gate;

a p+ type barrier implant located in the epitaxial layer at
   least partially under a portion of the transfer gate; and
an anti-blooming gate;
wherein a portion of the p+ type barrier implant is located
   at least partially under a portion of the anti-blooming
   gate;
wherein the anti-blooming gate is located on an opposite
   side of the photodiode from the transfer gate; and
wherein the p+ type barrier implant extends from under
   the portion of the transfer gate across a length of the
   photodiode to under the portion of the anti-blooming
   gate.

\* \* \* \* \*